(12) United States Patent
Takahata

(10) Patent No.: US 12,198,976 B2
(45) Date of Patent: Jan. 14, 2025

(54) TEMPLATE, METHOD OF MANUFACTURING TEMPLATE, AND METHOD OF MANUFACTURING SEMICONDUCTOR DEVICE

(71) Applicant: Kioxia Corporation, Tokyo (JP)

(72) Inventor: Kazuhiro Takahata, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 539 days.

(21) Appl. No.: 17/447,025

(22) Filed: Sep. 7, 2021

(65) Prior Publication Data

US 2022/0084877 A1 Mar. 17, 2022

(30) Foreign Application Priority Data

Sep. 17, 2020 (JP) ................... 2020-156094

(51) Int. Cl.
*B29C 59/02* (2006.01)
*H01L 21/768* (2006.01)

(52) U.S. Cl.
CPC .. *H01L 21/76817* (2013.01); *H01L 21/76877* (2013.01); *B29C 59/02* (2013.01)

(58) Field of Classification Search
None
See application file for complete search history.

(56) References Cited

U.S. PATENT DOCUMENTS

| 10,288,999 B2 | 5/2019 | Choi |
| 11,191,164 B2 | 11/2021 | Kasai et al. |
| 2011/0315077 A1 | 12/2011 | Asano |
| 2018/0169910 A1 | 6/2018 | Choi |
| 2018/0310413 A1* | 10/2018 | Kasai ............... H01L 23/544 |
| 2022/0046801 A1 | 2/2022 | Kasai et al. |

FOREIGN PATENT DOCUMENTS

| JP | 2010-219456 A | 9/2010 |
| JP | 2012-9686 A | 1/2012 |
| JP | 2018-14497 A | 1/2018 |
| JP | 2018-101780 A | 6/2018 |
| JP | 2020-17746 A | 1/2020 |

* cited by examiner

*Primary Examiner* — Suberr L Chi
*Assistant Examiner* — Carnell Hunter, III
(74) *Attorney, Agent, or Firm* — Finnegan, Henderson, Farabow, Garrett & Dunner, LLP

(57) ABSTRACT

According to one embodiment, there is provided a template including: a substrate having a first surface; a trench that is recessed from the first surface at a predetermined depth and extends along the first surface in a first direction, the trench includes a first portion having a second width in a second direction intersecting with the first direction and a second portion having a third width in the second direction; and a hole that is arranged is the first portion of the trench and extends from a bottom surface of the trench, and the first width is smaller than the second width, and the third width is smaller than the first width.

4 Claims, 20 Drawing Sheets

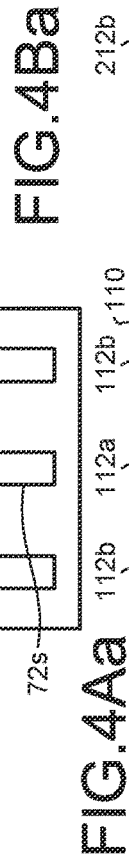
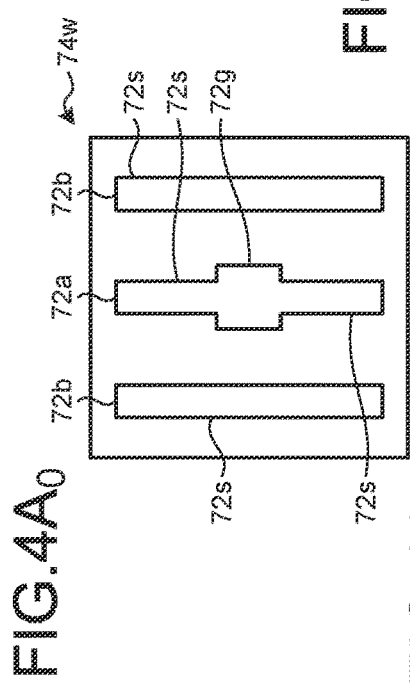
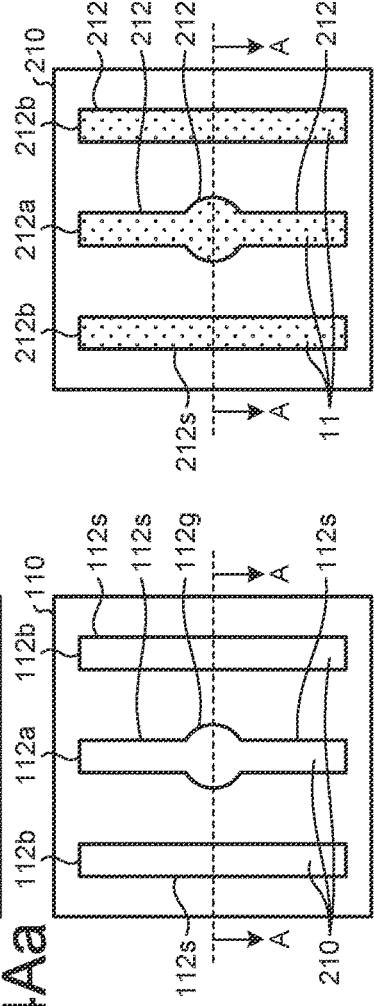
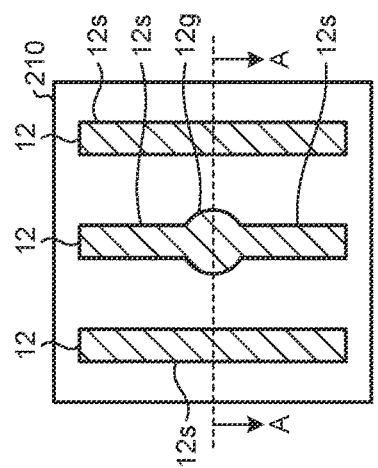
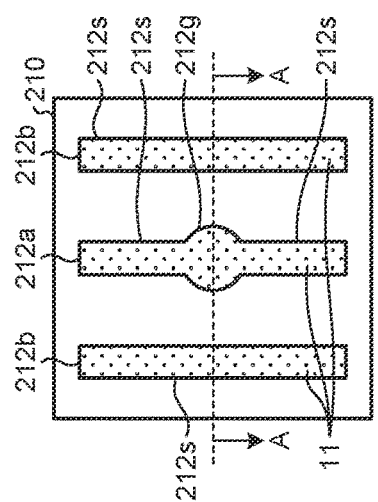
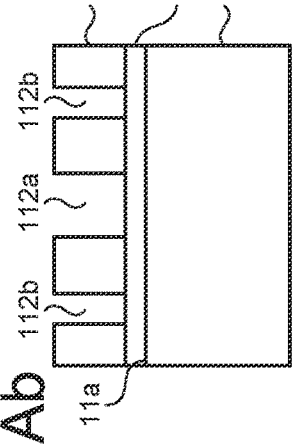
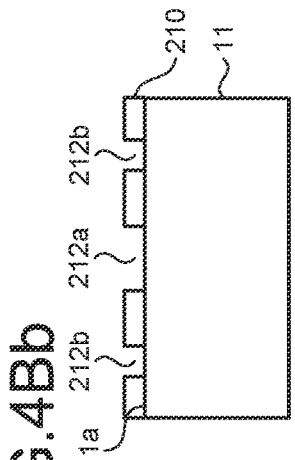

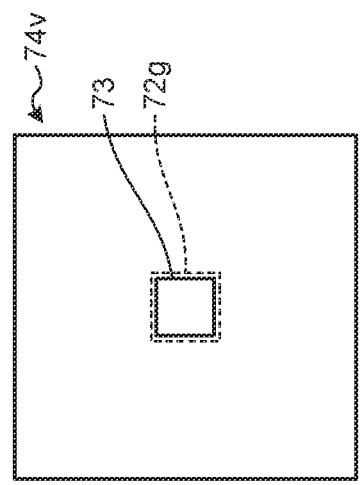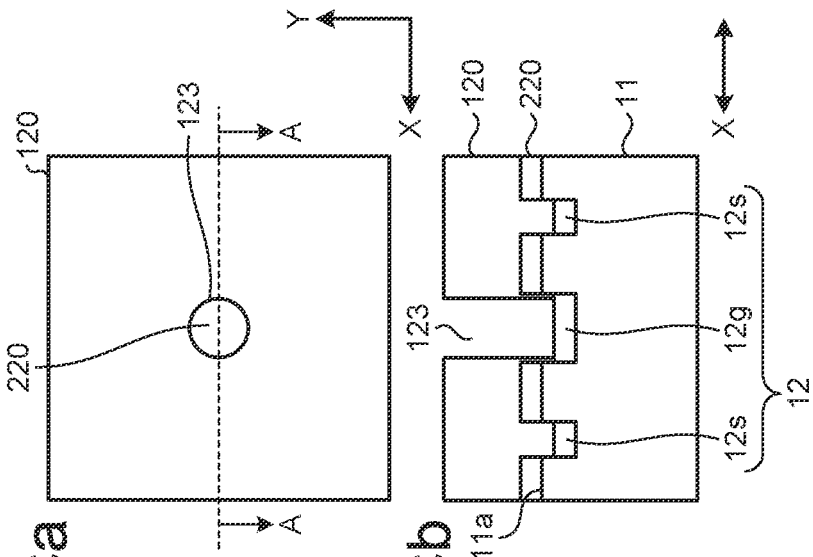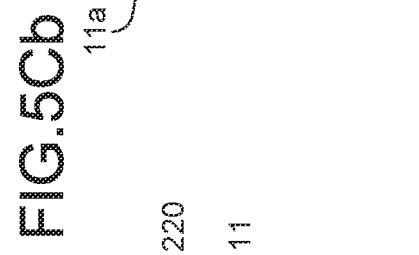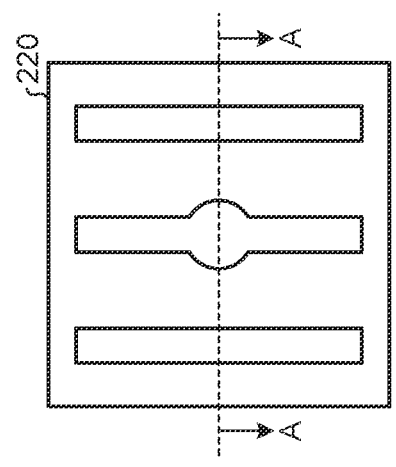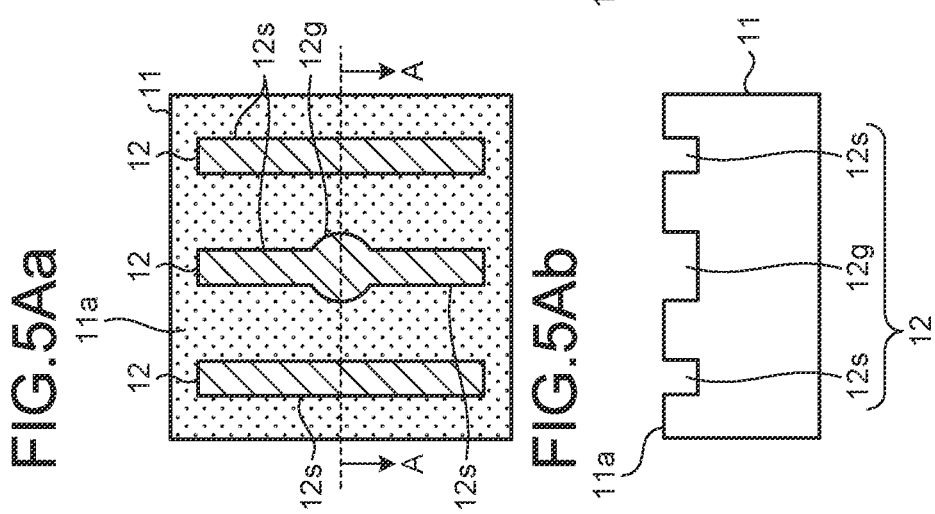

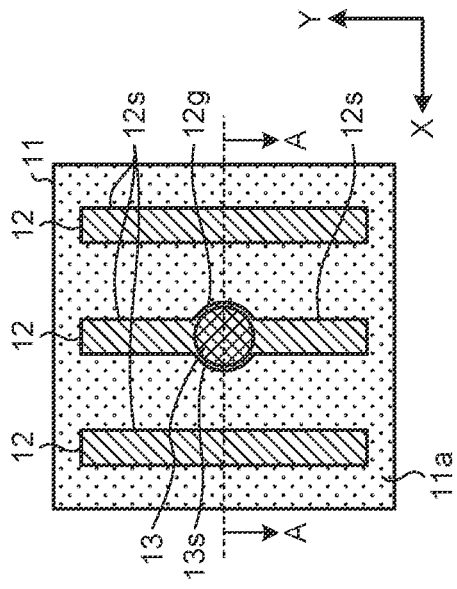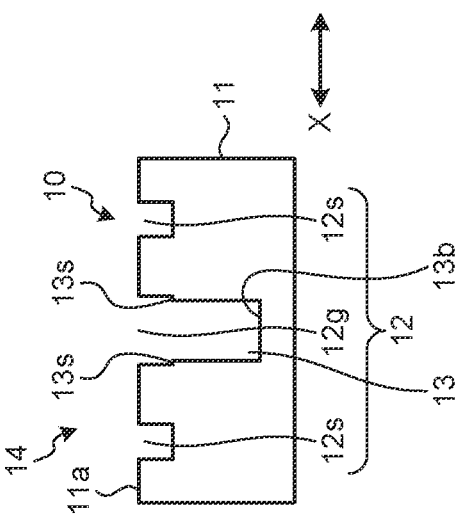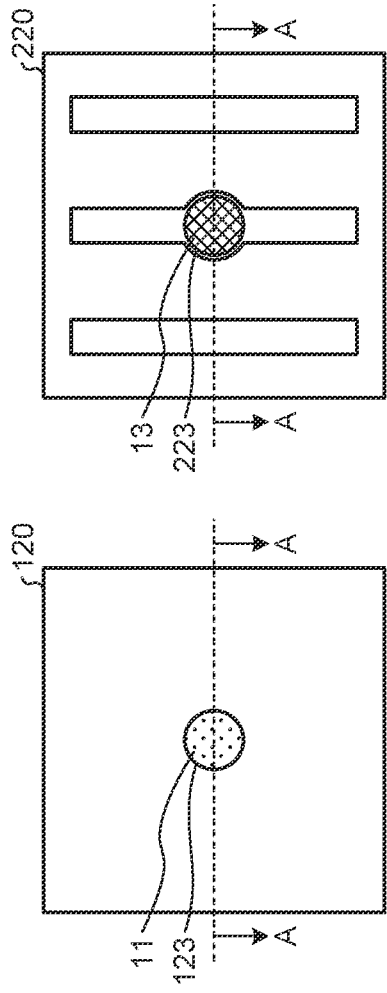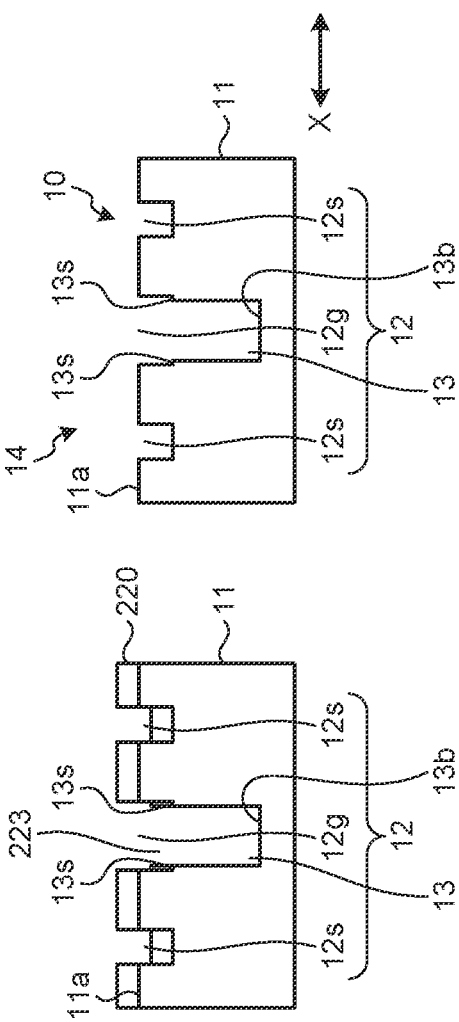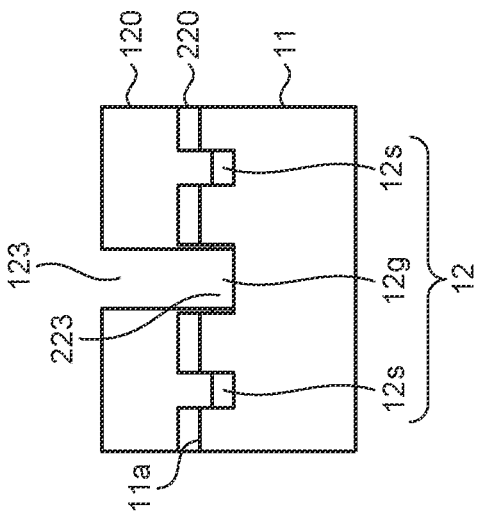

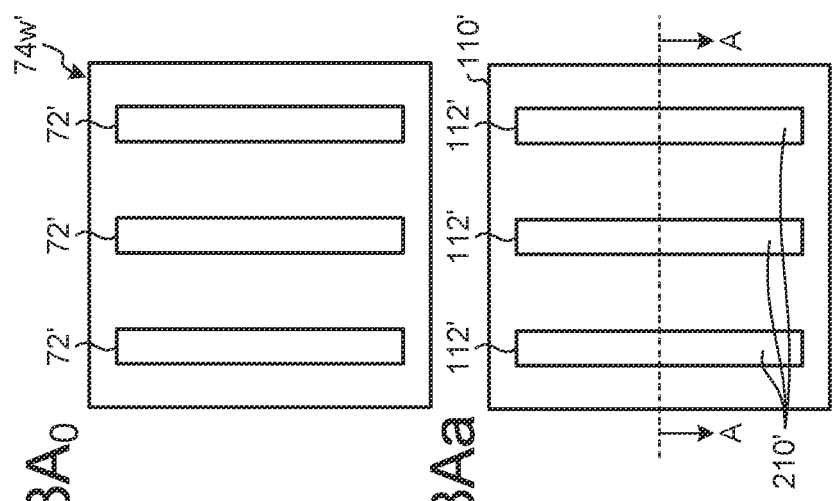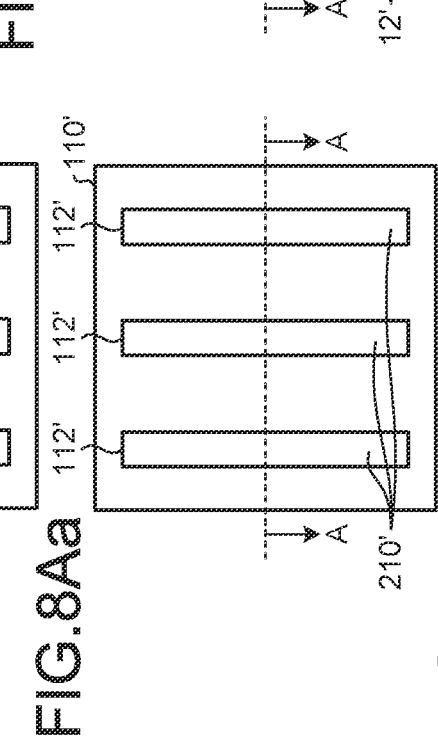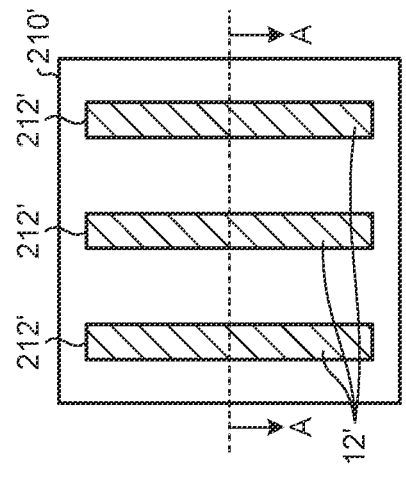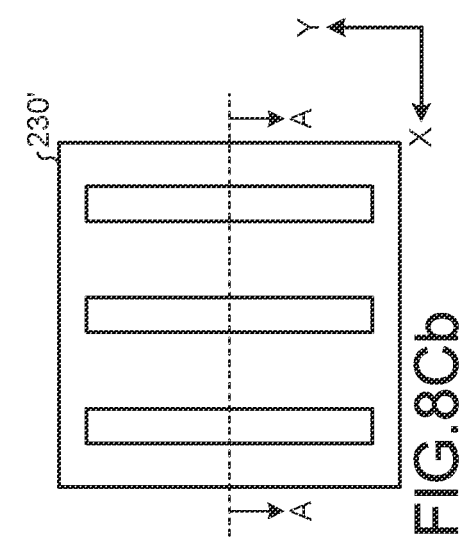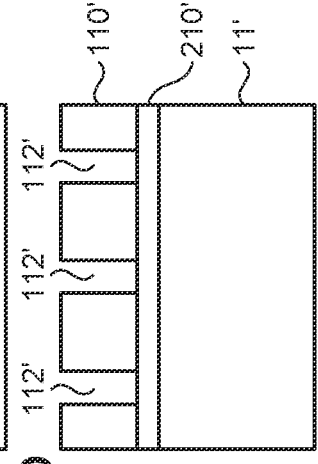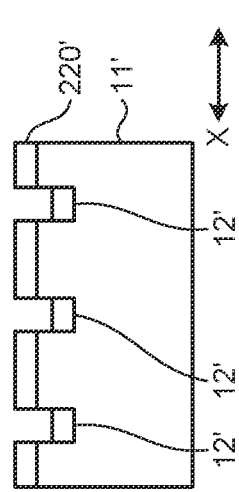

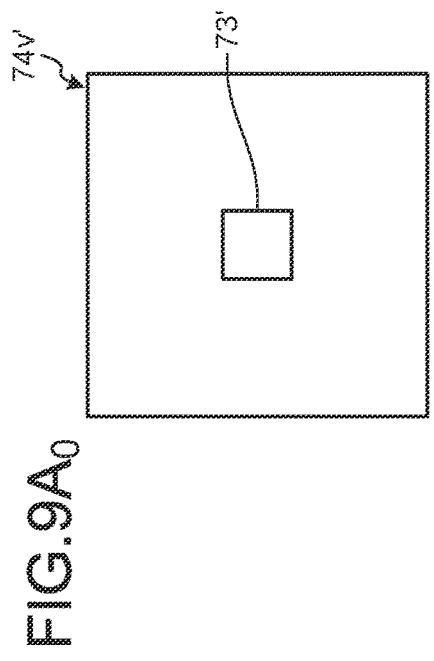
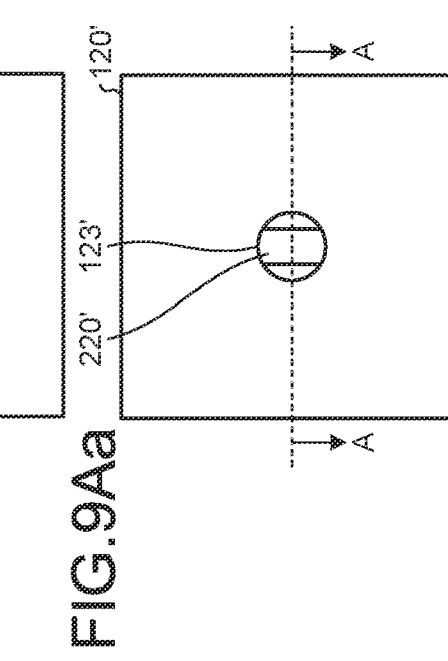
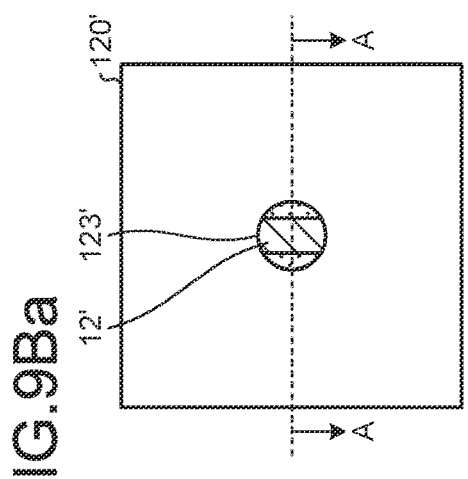
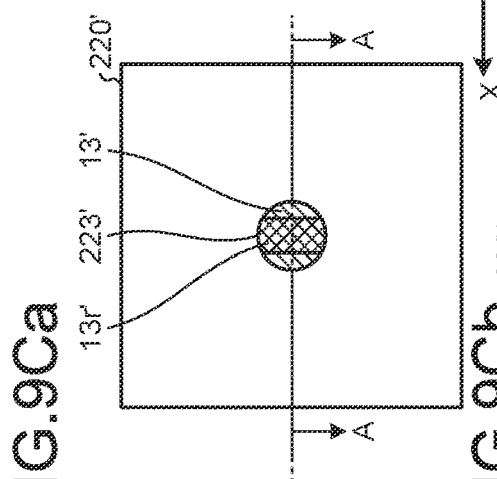
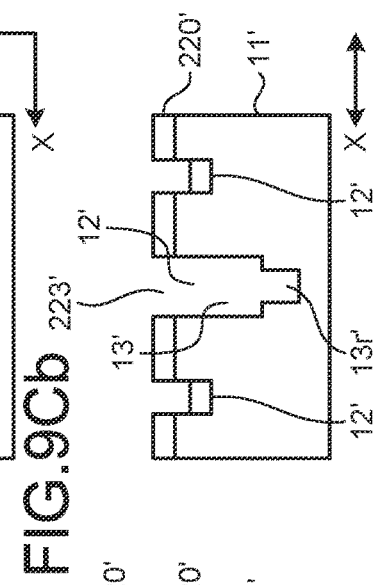
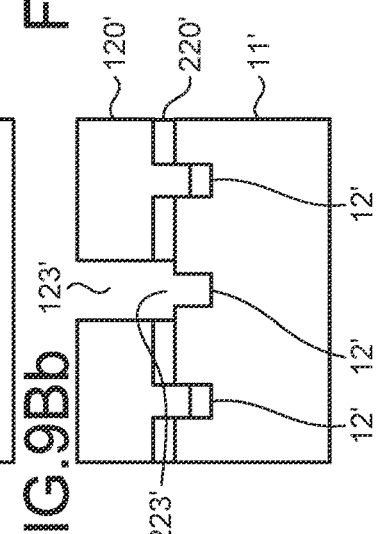
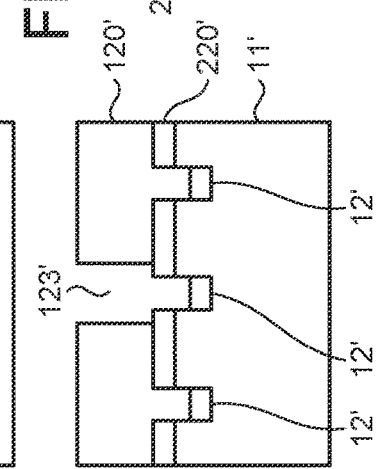
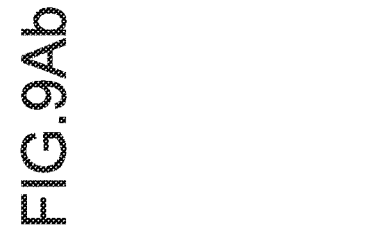

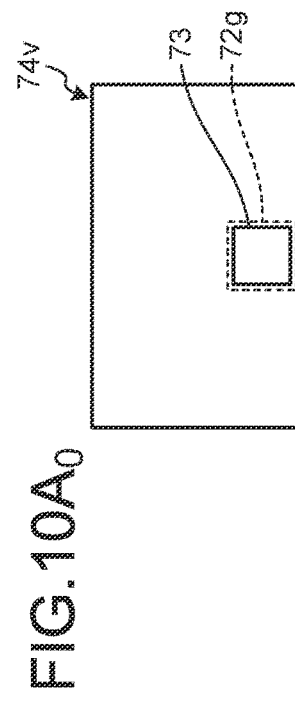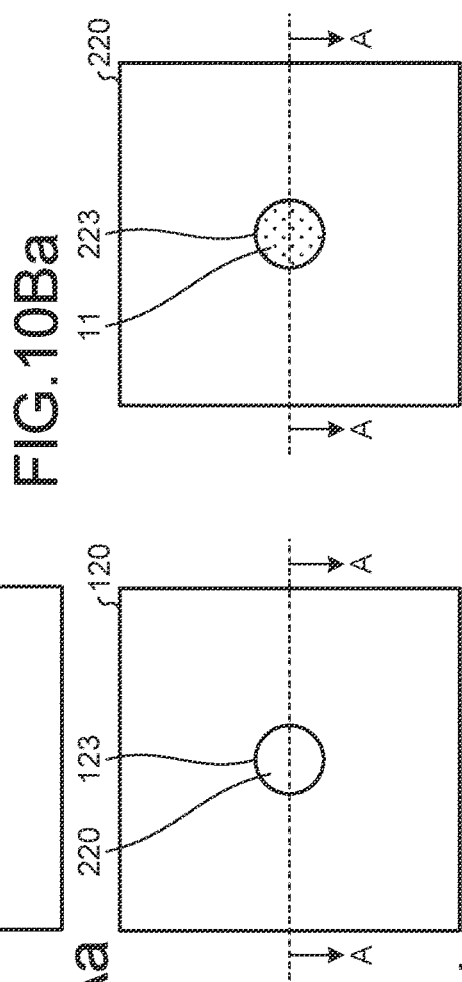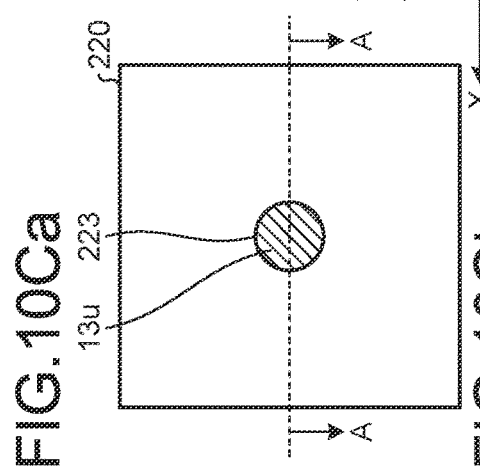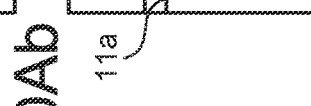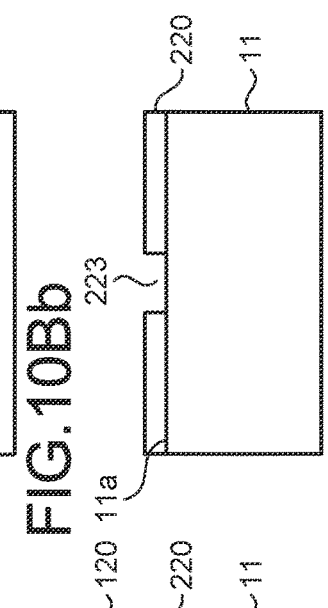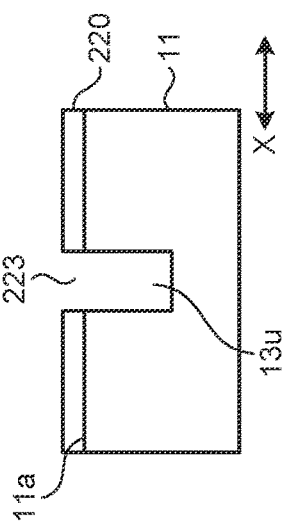

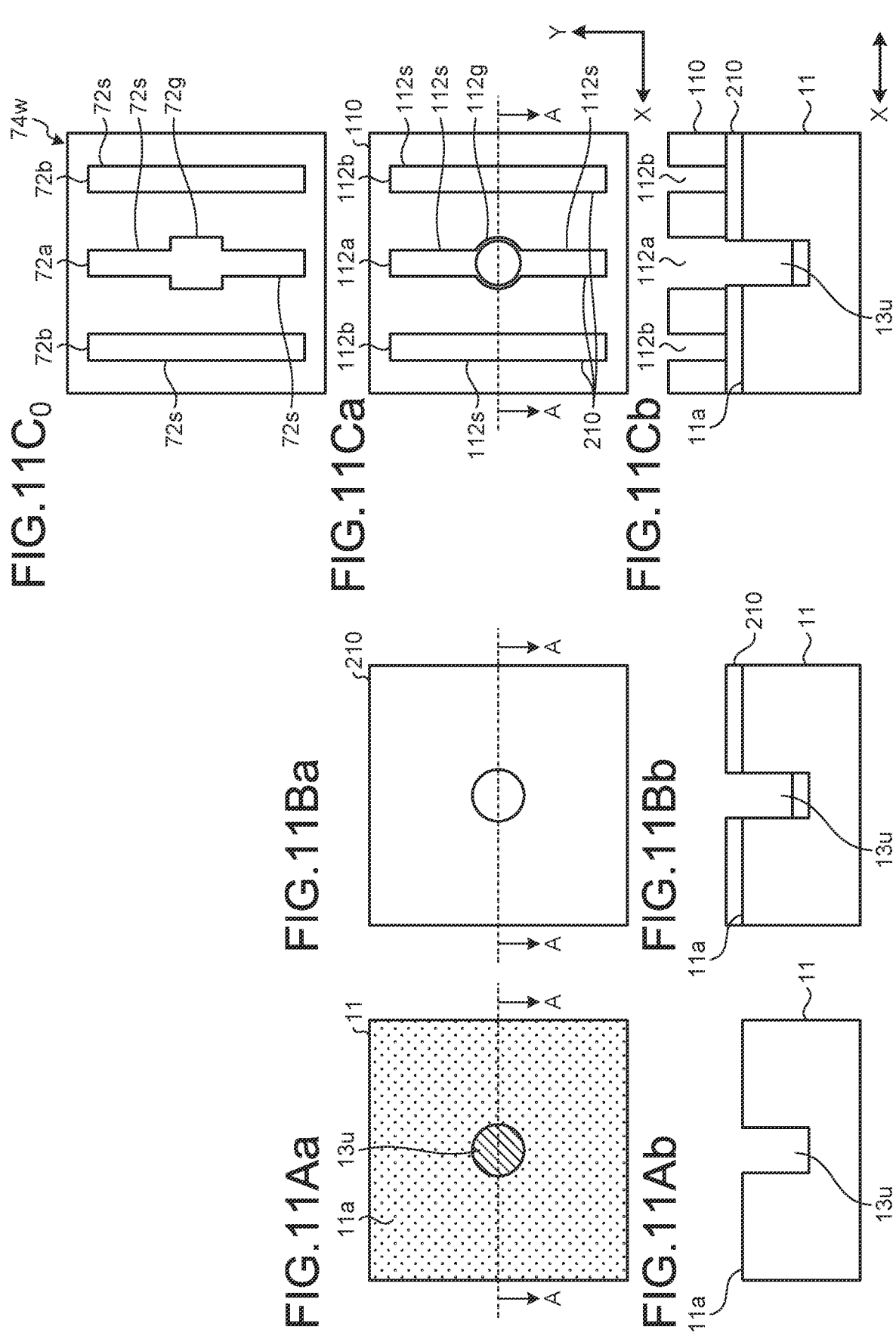

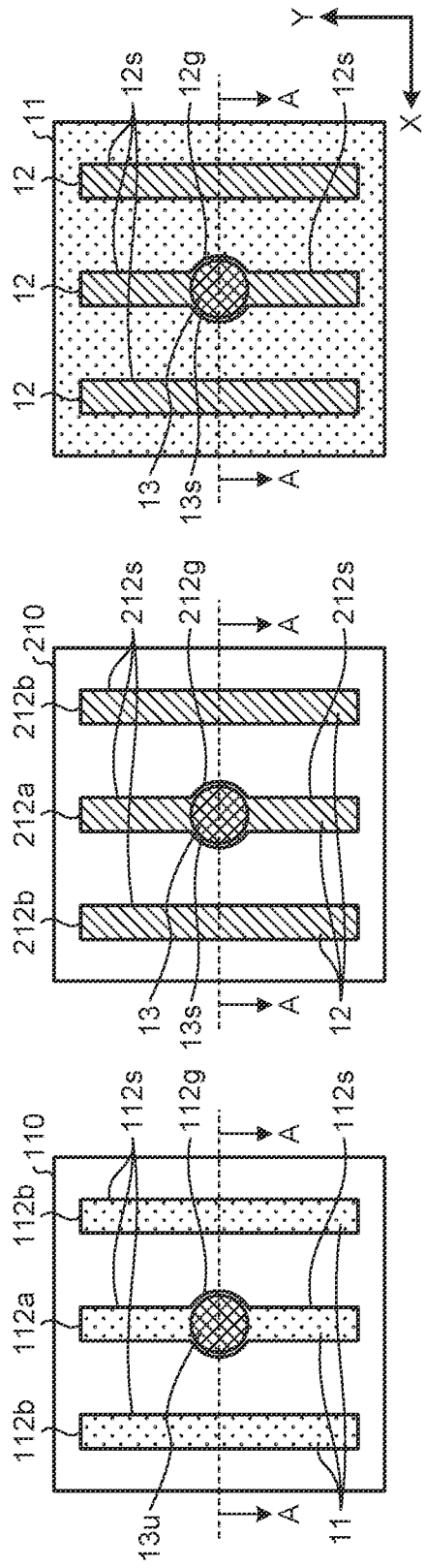

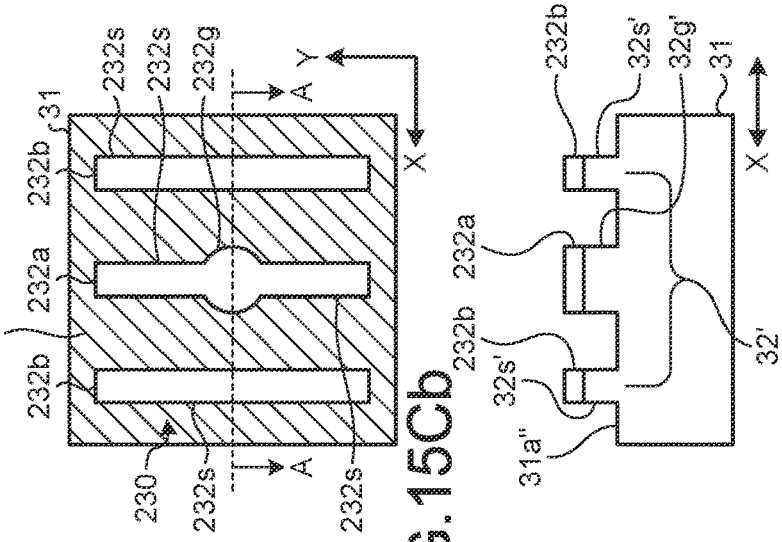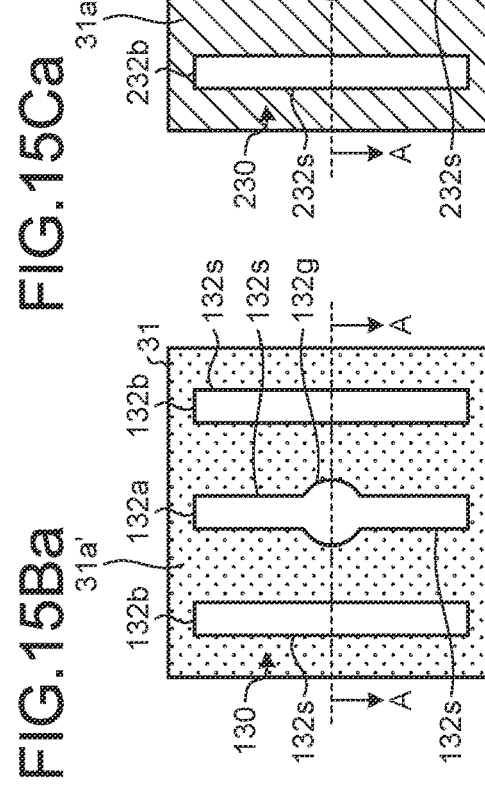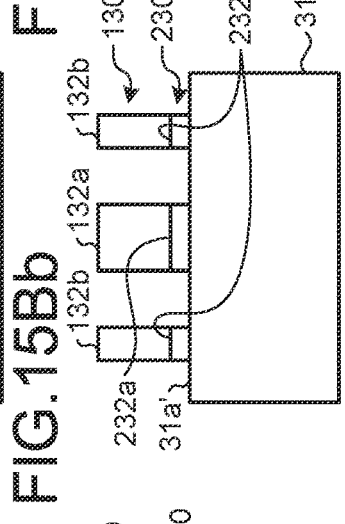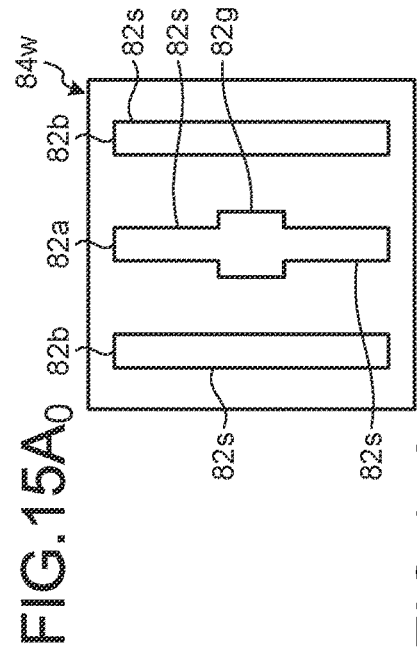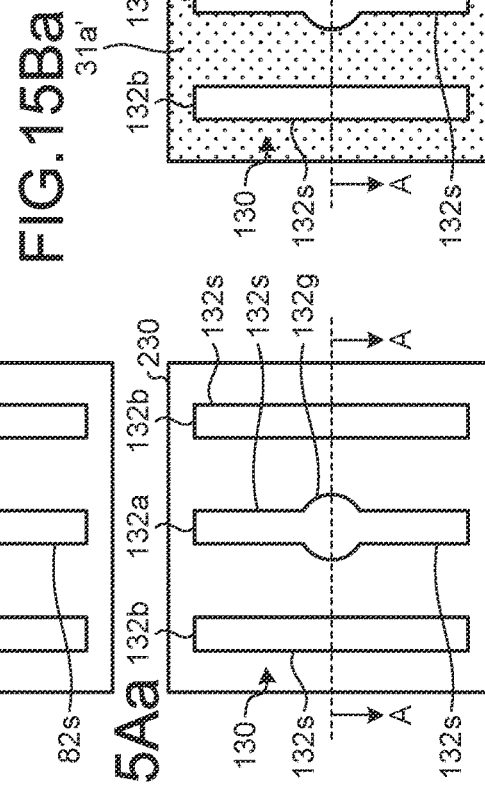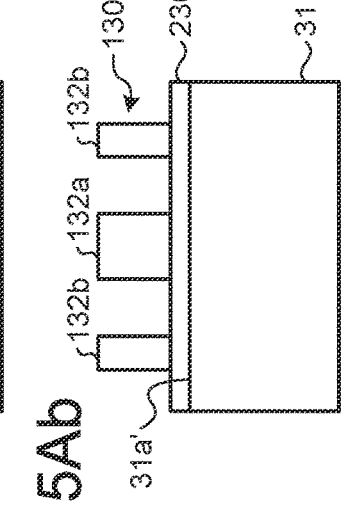

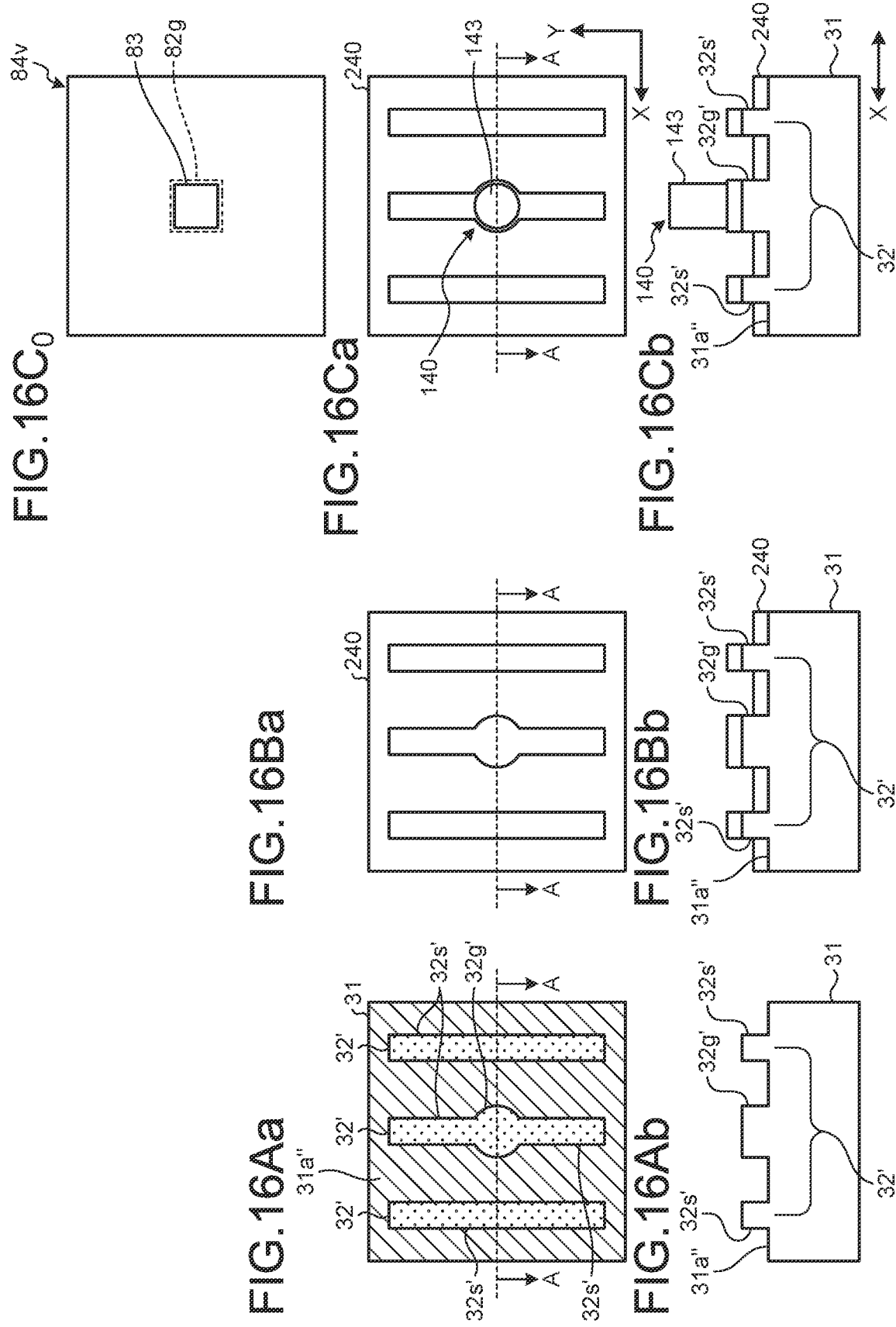

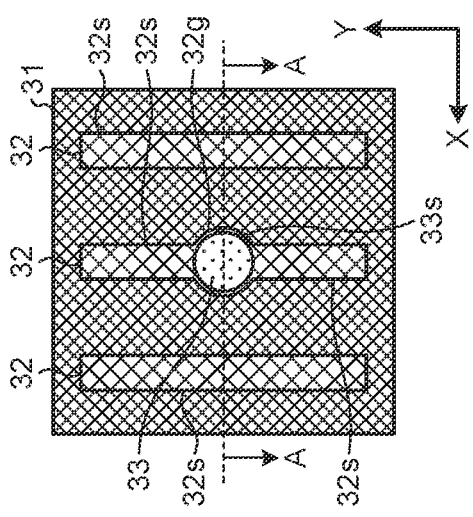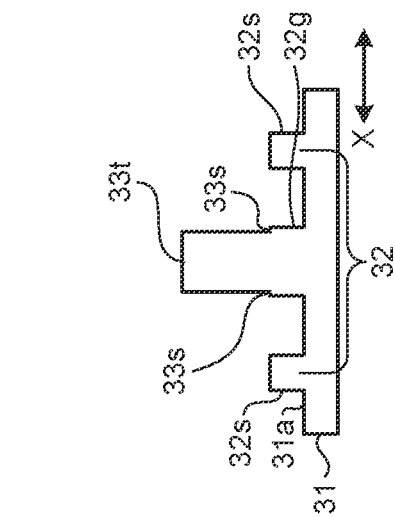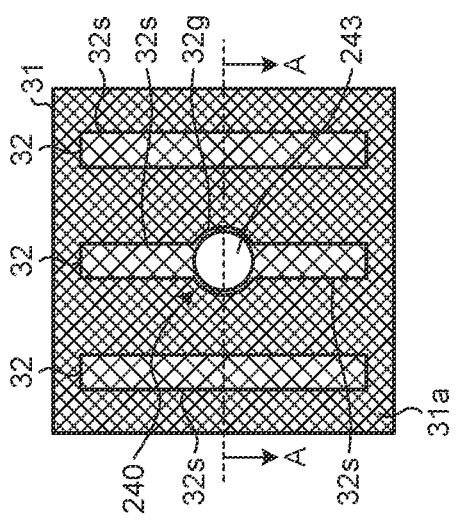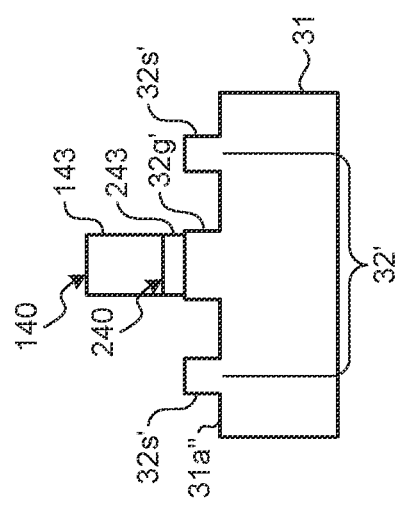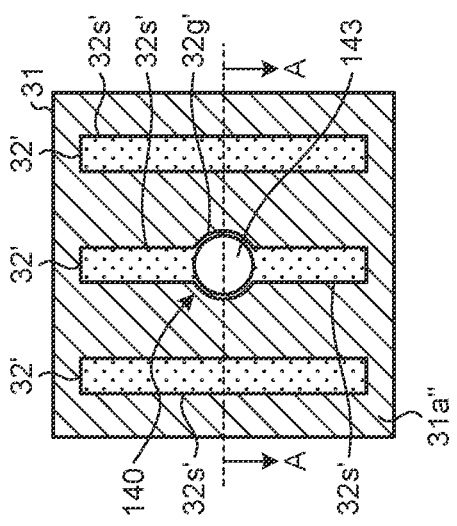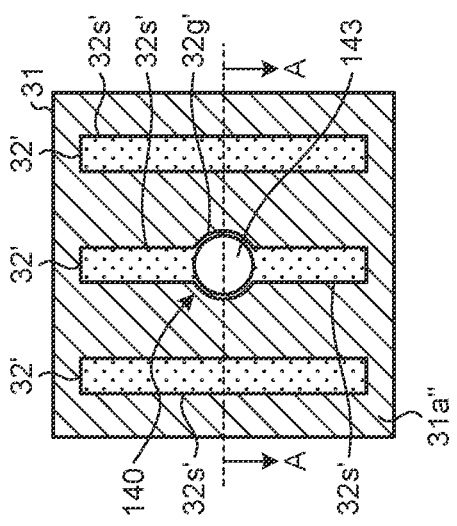

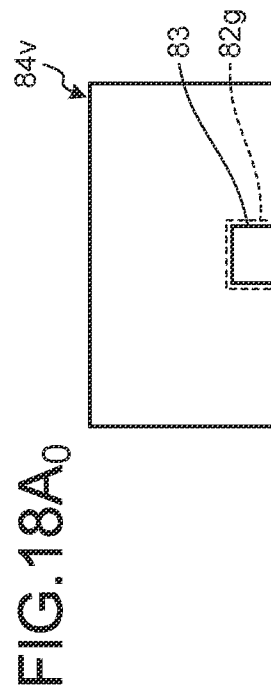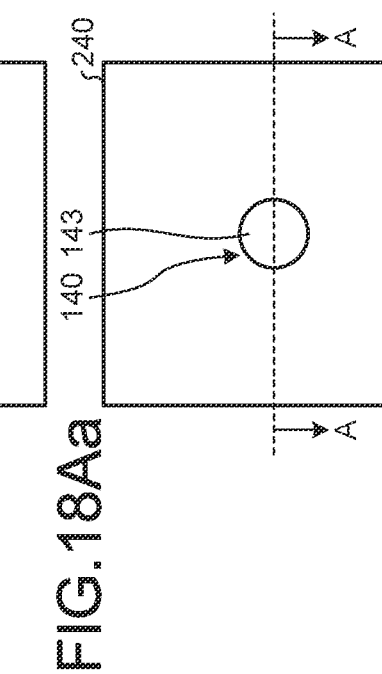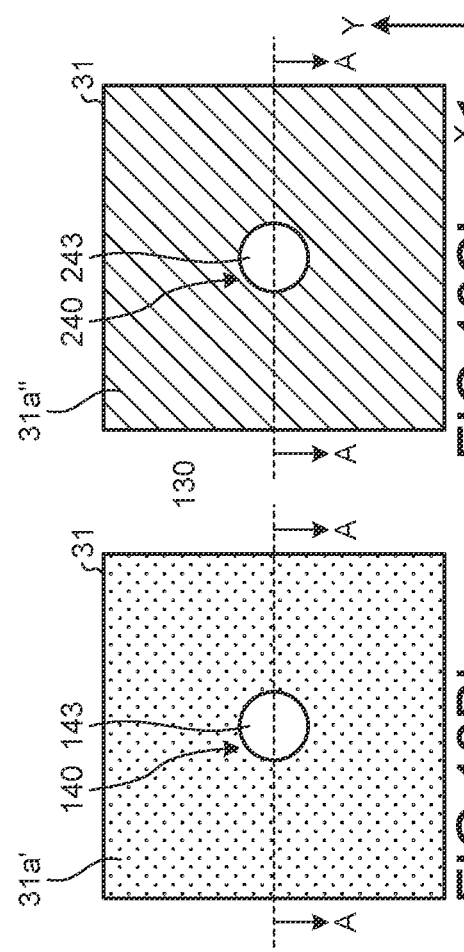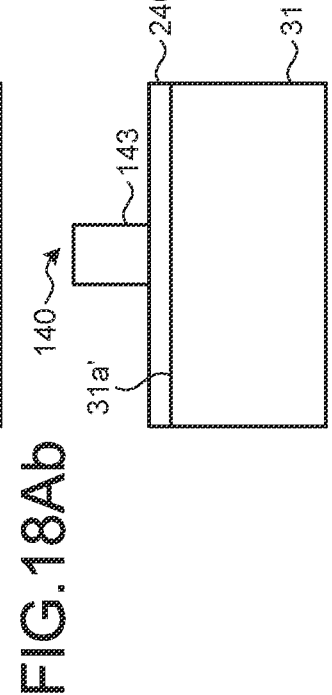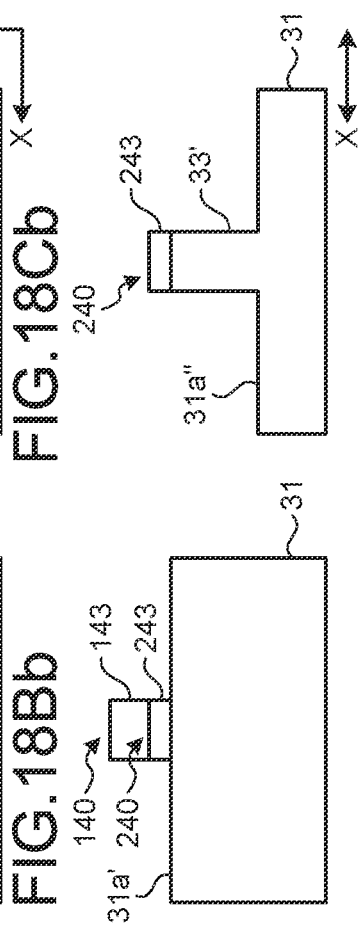

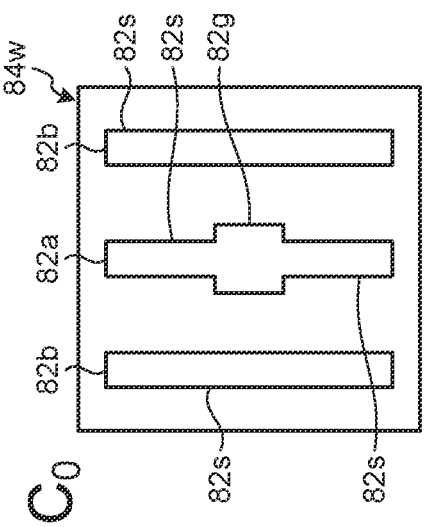
FIG. 19Aa
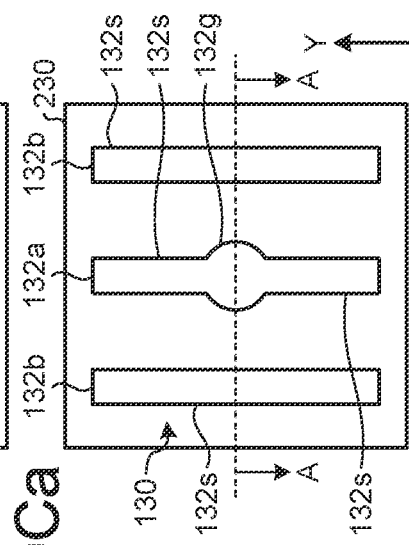
FIG. 19Ba
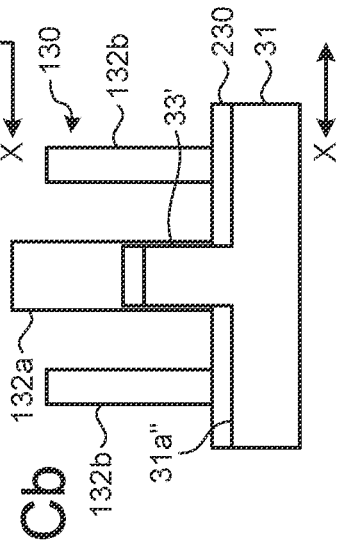
FIG. 19Ca
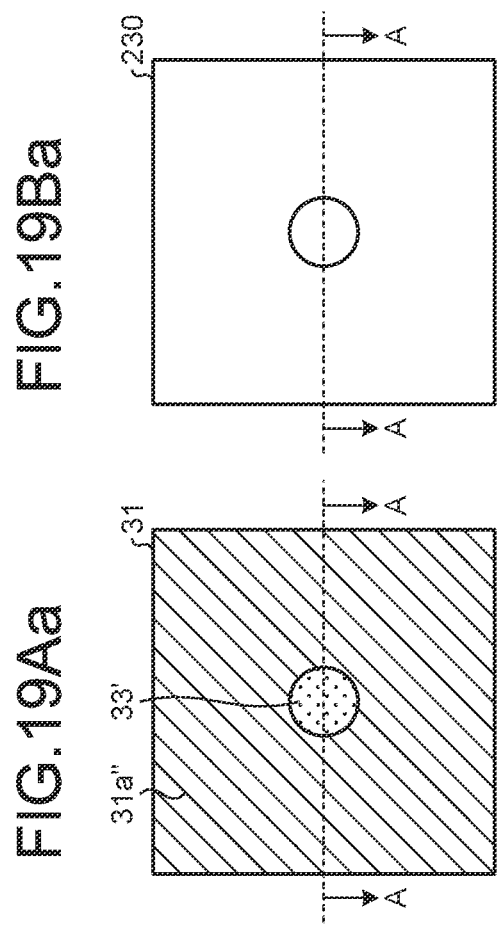
FIG. 19Ab
FIG. 19Bb
FIG. 19Cb
FIG. 19C0

TEMPLATE, METHOD OF MANUFACTURING TEMPLATE, AND METHOD OF MANUFACTURING SEMICONDUCTOR DEVICE

CROSS-REFERENCE TO RELATED APPLICATIONS

This application is based upon and claims the benefit of priority from Japanese Patent Application No. 2020-156094, filed on Sep. 17, 2020; the entire contents of which are incorporated herein by reference.

FIELD

Embodiments described herein relate generally to a template, a method of manufacturing a template, and a method of manufacturing a semiconductor device.

BACKGROUND

In a manufacturing process of a semiconductor device, a dual damascene method of collectively forming a via connected to a lower structure and an upper wiring connected to the via may be used.

In addition, a technique of an imprint method may be used for forming the via and the upper wiring by a dual damascene method. In the imprint method, a resist is formed on a film to be processed, a template on which a pattern is formed is pressed against the resist film, and the pattern of the template is transferred to the resist film.

In accordance with miniaturization of the semiconductor device, an imprinting technique capable of forming a via having a diameter larger than a width of a wiring is required.

BRIEF DESCRIPTION OF THE DRAWINGS

FIGS. 1A to 2F are schematic views illustrating an outline of a flow of forming a wiring and a via by a dual damascene method using an imprinting technique according to a first embodiment;

Figure 7:
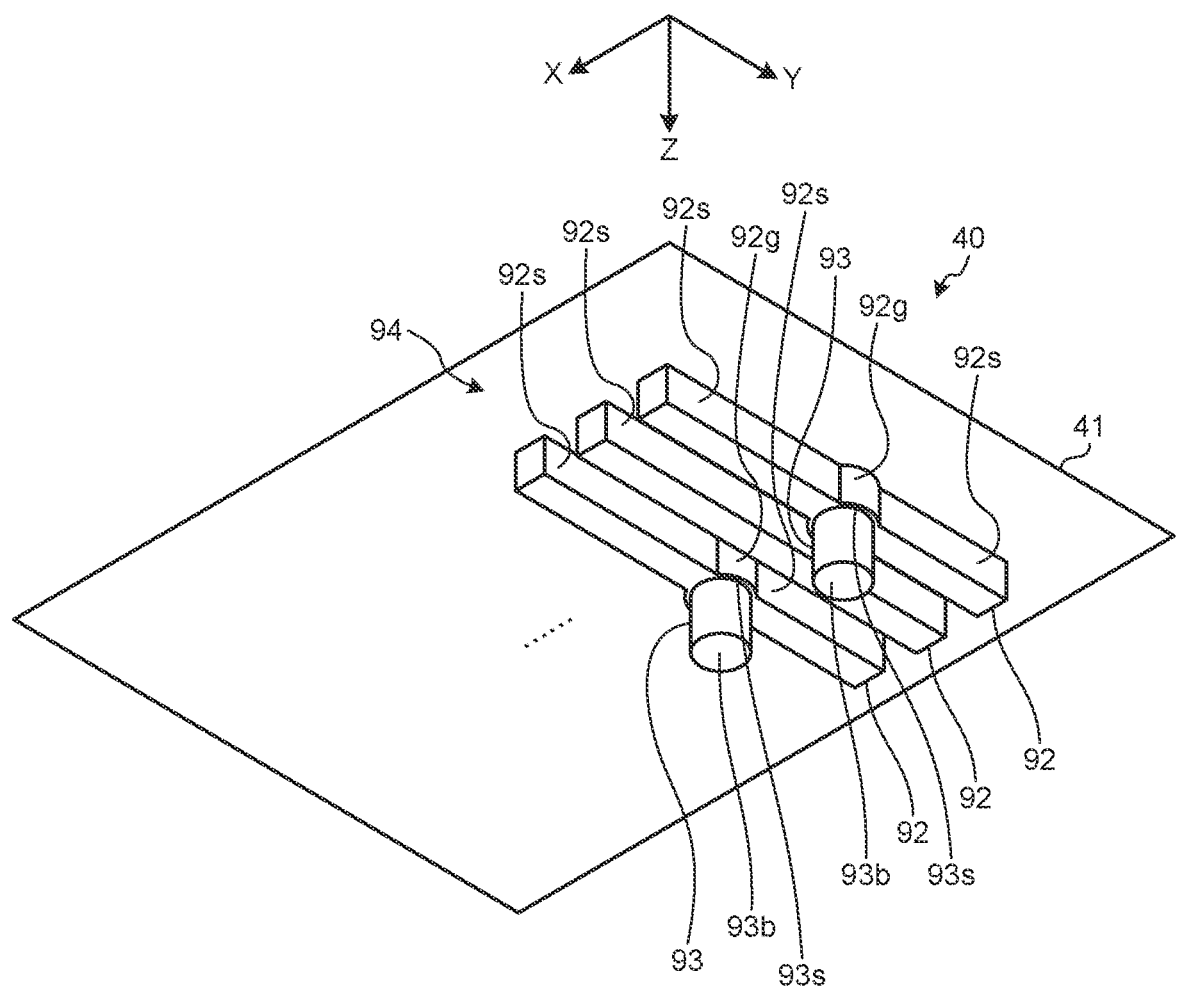
Figure 13A:
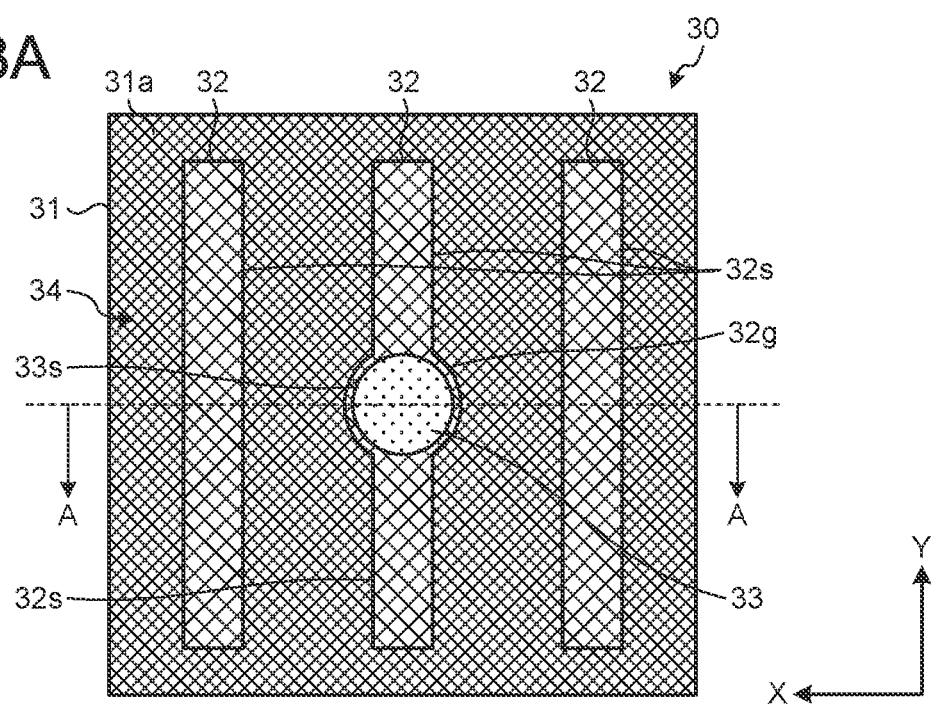
Figure 13B:
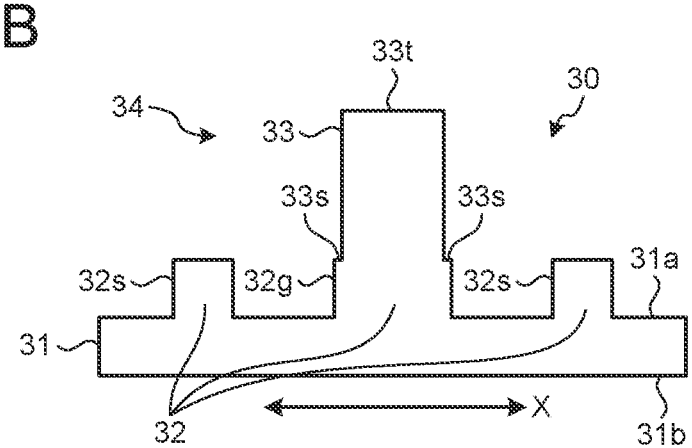
Figure 13C:
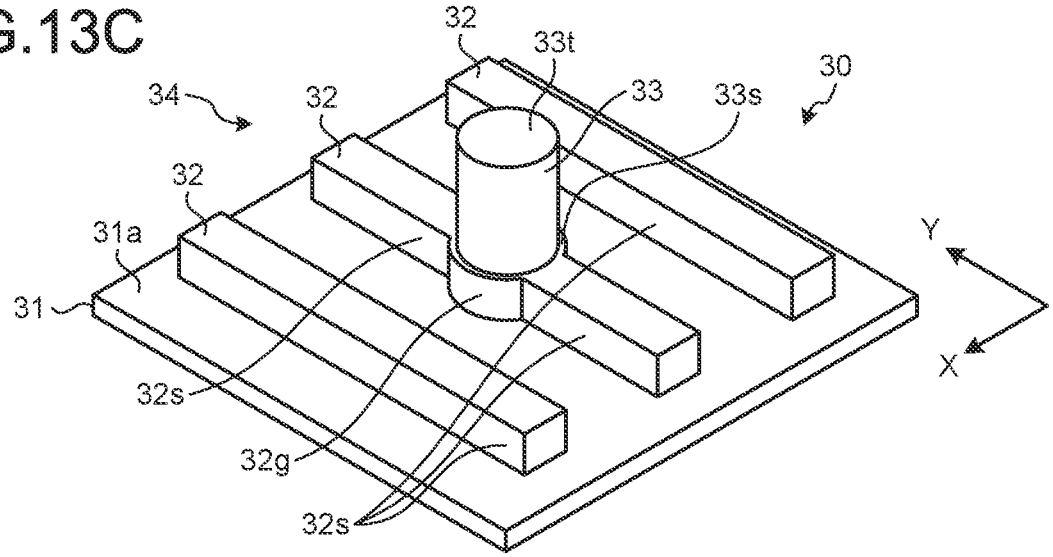
Figure 14A:
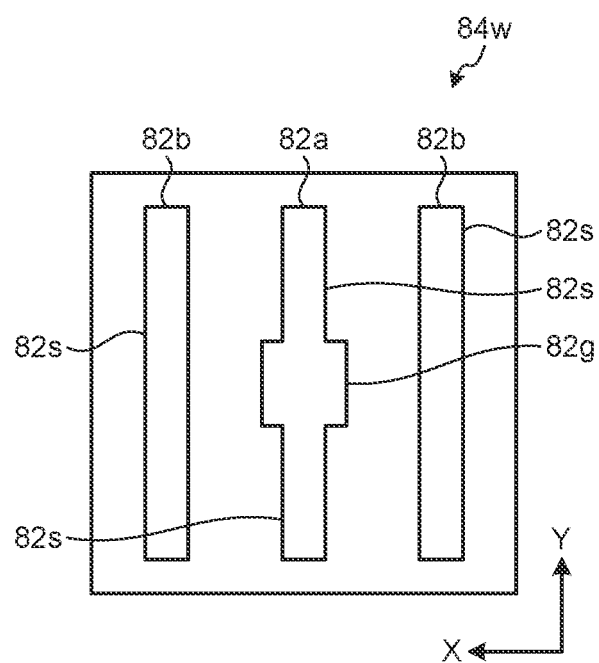
Figure 14B:
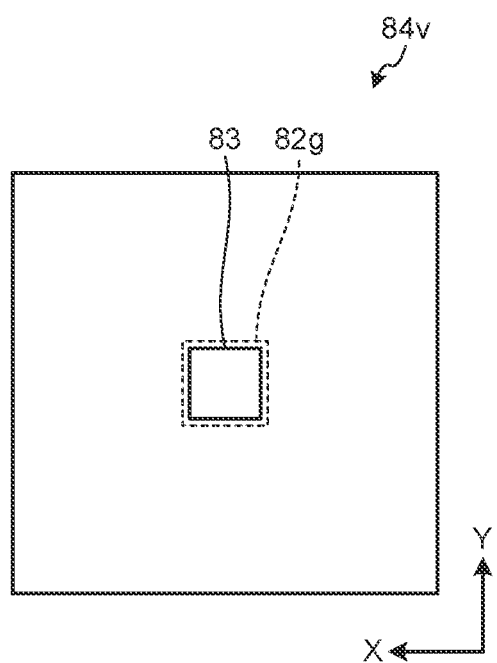
Figure 20A:
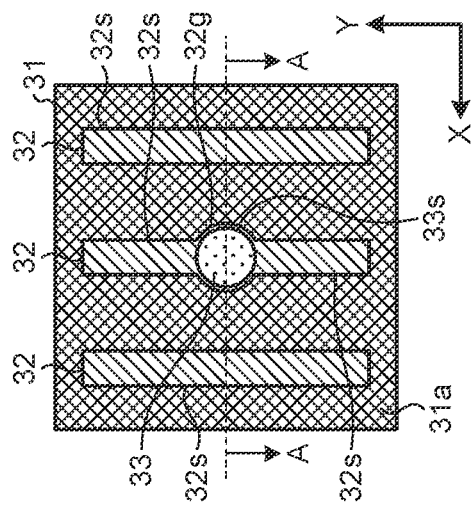
Figure 20A:
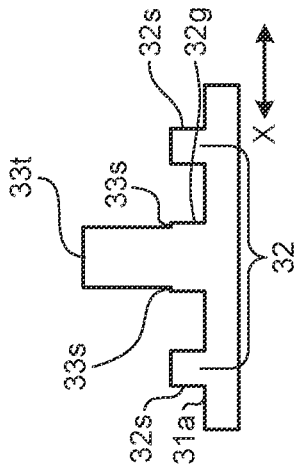

FIGS. $4A_0$ to 4Cb are views illustrating an example of a procedure of a method of manufacturing the master template according to the first embodiment;

FIGS. 5Aa to 5Cb are views illustrating an of the procedure of the method of manufacturing the master template according to the first embodiment;

FIGS. 6Aa to 6Cb are views illustrating an example of the procedure of the method of manufacturing the master template according to the first embodiment;

FIG. 7 is a perspective view illustrating an example of a configuration of a dual damascene pattern formed on a semiconductor device according to the first embodiment;

FIGS. $8A_0$ to 8Cb are views illustrating an example of a procedure of a method of manufacturing a master template according to a comparative example;

FIGS. $9A_0$ to 9Cb are views illustrating an example of the procedure of the method of manufacturing the master template according to the comparative example;

FIGS. $10A_0$ to 10Cb are views illustrating an example of a procedure of a method of manufacturing a master template according to a modification of the first embodiment;

FIGS. 11Aa to 11Cb are views illustrating an example of the procedure of the method of manufacturing the master template according to the modification of the first embodiment;

FIGS. 12Aa to 12Cb are views illustrating an example of the procedure of the method of manufacturing the master template according to the modification of the first embodiment;

FIGS. 13A to 13C are views illustrating an example of a configuration of a template according to a second embodiment;

FIGS. 14A and 14B are views illustrating an example of EB drawing data used for manufacturing the template according to the second embodiment;

FIGS. $15A_0$ to 15Cb are views illustrating an example of a procedure of a method of manufacturing the template according to the second embodiment;

FIGS. 16Aa to 16Cb are views illustrating an example of the procedure of the method of manufacturing the template according to the second embodiment;

FIGS. 17Aa to 17Cb are views illustrating an example of the procedure of the method of manufacturing the template according to the second embodiment;

FIGS. $18A_0$ to 18Cb are views illustrating an example of a procedure of a method of manufacturing a template according to a modification of the second embodiment;

FIGS. 19Aa to 19Cb are views illustrating an example of the procedure of the method of manufacturing the template according to the modification of the second embodiment; and FIGS. 20Aa to 20Cb are views illustrating an example of the procedure of the method of manufacturing the template according to the modification of the second embodiment.

DETAILED DESCRIPTION

According to one embodiment, there is provided a template including: a substrate having a first surface; a trench that is recessed from the first surface at a predetermined depth and extends along the first surface in a first direction, the trench includes a first portion having a second width in a second direction intersecting with the first direction and a second portion having a third width in the second direction; and a hole that is arranged in the first portion of the trench and extends from a bottom surface of the trench, and the first width is smaller than the second width, and the third width is smaller than the first width.

Hereinafter, the present invention be described in detail with reference to the drawings. Note that the present invention is not limited by the following embodiments. In addition, constituent elements in the following embodiments include those that can be easily assumed by those skilled in the art or those that are substantially the same.

[First Embodiment]

Hereinafter, a first embodiment will be described in detail with reference to the drawings.

(Outline of Dual Damascene by Imprint Method)

FIGS. 1A to 1F are schematic views illustrating an outline of a flow of forming a wiring and a via by a dual damascene method using an imprinting technique according to a first embodiment. An object of the first embodiment is to form a via having a diameter larger than a line width of a wiring.

As illustrated in FIGS. 1A to 1E, in the imprinting technique of the first embodiment, first, a master template 10 is manufactured. A replica template 20 is mass-produced from the master template 10, and a wiring and a via are formed in a semiconductor device 40 using the replica template 20.

The replica template 20 repeatedly used in a manufacturing process of the semiconductor device 40 is a consumable. Therefore, as described above, by preparing the master template 10, the replica template 20 can be easily mass-produced at a low cost.

Figure 1A:
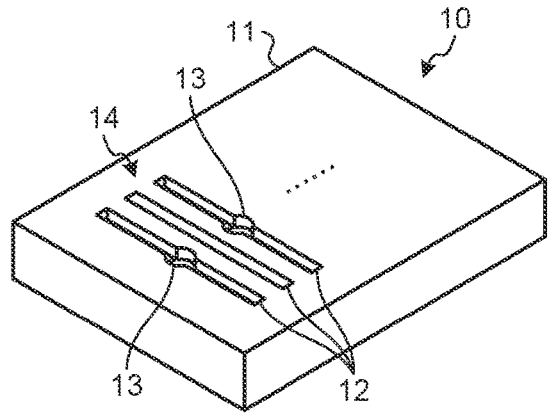

As illustrated in FIG. 1A, the master template 10 has a transfer pattern 14 that is formed in a substrate 11 formed of quartz or the like and has trenches 12 and holes 13. The hole 13 is arranged at a position overlapping with the trench 12 and reaches a position deeper than the trench 12 in the substrate 11. In addition, the hole 13 is formed so that a diameter thereof is larger than a width of the trench 12.

A resist film (not illustrated) is formed on a substrate 21 for manufacturing the replica template 20, the transfer pattern 14 of the master template 10 is pressed against the resist film and transferred, and then the substrate 21 is processed according to a pattern of the resist film, thereby manufacturing the replica template 20.

Figure 1B:
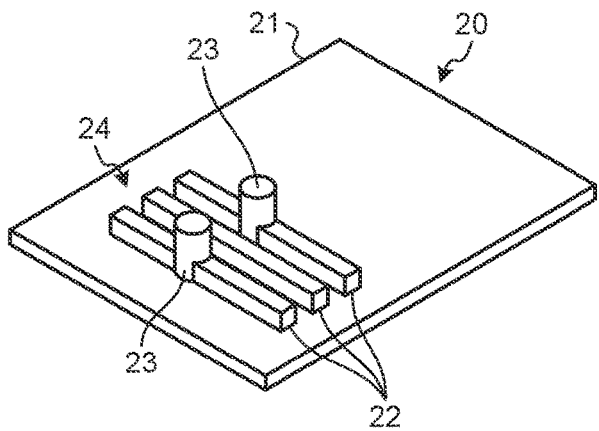

As illustrated in FIG. 1B, the replica template 20 has a transfer pattern 24 that is formed on a substrate 21 formed of quartz or the like and has a linear protrusion 22 and a columnar portion 23 arranged on the protrusion 22.

Figure 1C:
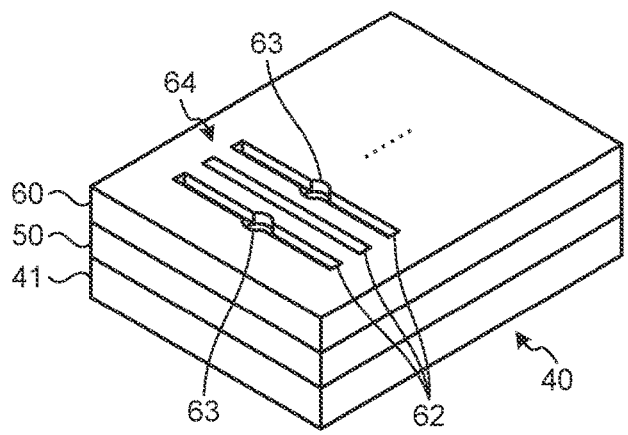

As illustrated in FIG. 1C, the semiconductor device 40 includes a film 41 to be processed to which a wiring and a via are transferred, the film 41 being formed of $SiO_2$, SiN, SiON, or the like. A carbon (spin on carbon (SOC)) film 50 as a carbon-containing film is formed on the film 41 to be processed. A resist film 60 is formed on the carbon film 50.

The transfer pattern 24 of the replica template 20 is pressed against the resist film 60. Therefore, a pattern 64 having trenches 62 and holes 63 is formed in the resist film 60. Then, the carbon film 50 is processed according to the pattern 64 of the resist film 60, and the pattern 64 is transferred to the carbon film 50. Further, the film 41 to be processed of the semiconductor device 40 is processed according to a pattern (not illustrated) of the carbon film 50.

Figure 1D:
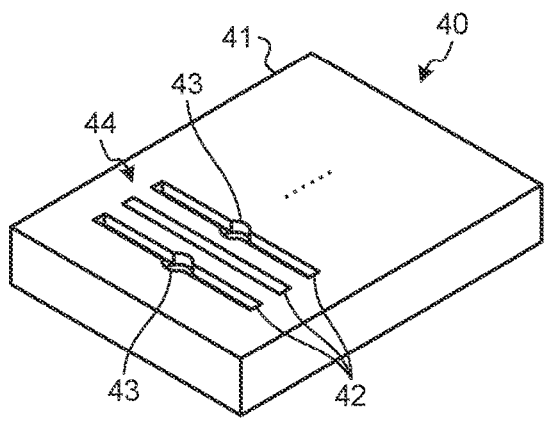

As illustrated in FIG. 1D, the pattern 64 of the resist film 60 is transferred via the carbon film 50, such that a pattern 44 having trenches 42 and holes 43 is formed in the film 41 to be processed. The pattern 64 of the resist film 60 is followed, and the hole 43 is formed at a position overlapping the trench 42 with a diameter larger than a width of the trench 42 and reaches a position deeper than the trench 42 in the film 41 to be processed.

Figure 1E:
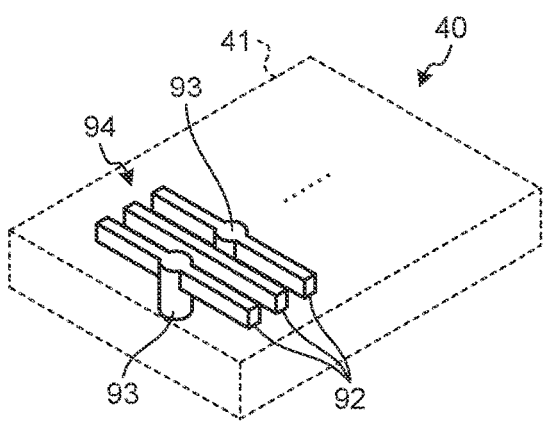

As illustrated in FIG. 1E, the pattern 44 of the film 41 to be processed is filled with a conductive material that is a single metal or an alloy of any one of Cu, Ru, Co, W, and the like. In addition, the pattern 44 may be filled with a plurality of layers by forming a barrier metal layer formed of TiN or the like prior to being filled with the conductive material. Therefore, a dual damascene pattern 94 having a wiring 92 in which the trench 42 is filled with the conductive material and a via 93 in which the hole 43 is filled with the conductive material is formed in the film 41 to be processed.

(Configuration Example of Master Template)

Next, a configuration example of the master template 10 according to the first embodiment will be described in detail with reference to FIGS. 2A to 2C.

Figure 2A:
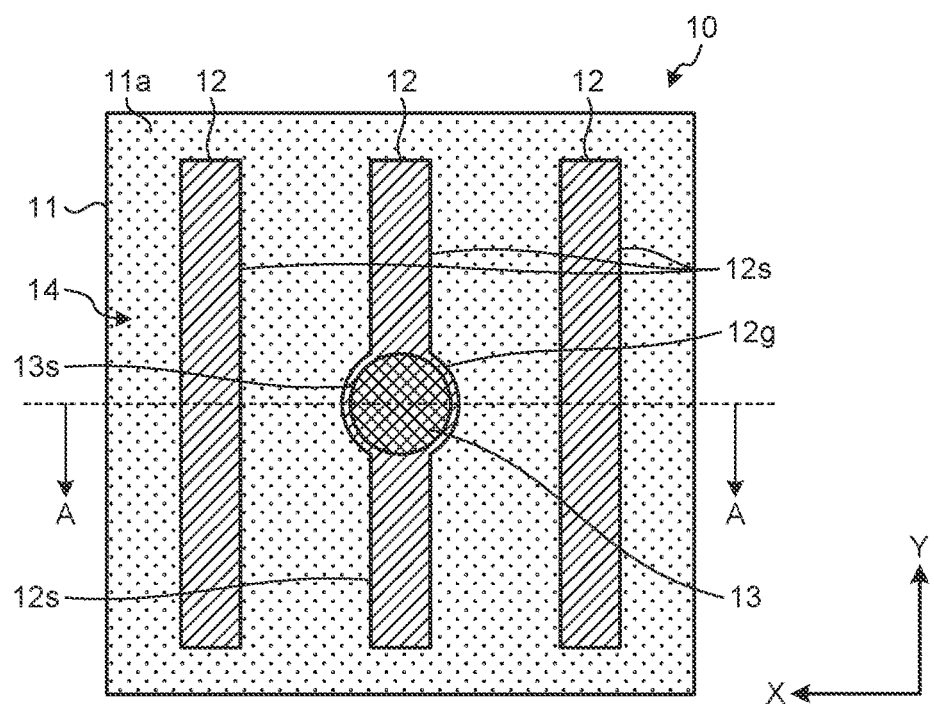
FIGS. 2A to 2C are views illustrating an example of a configuration of a master template according to the first embodiment.
Figure 2B:
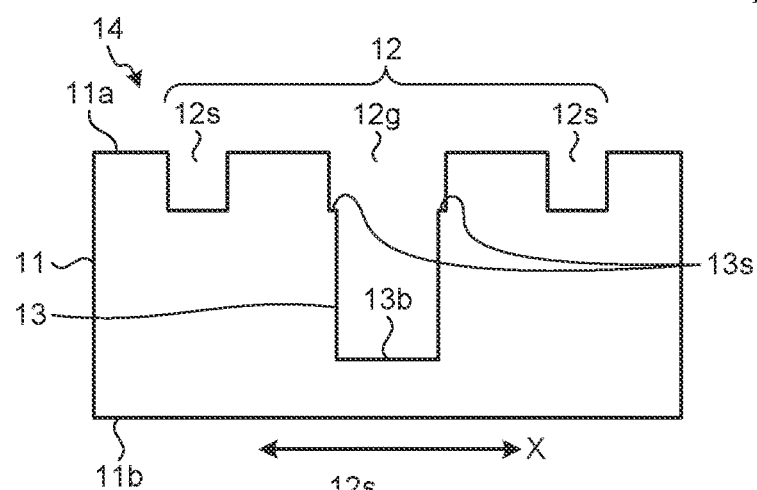
Figure 2C:
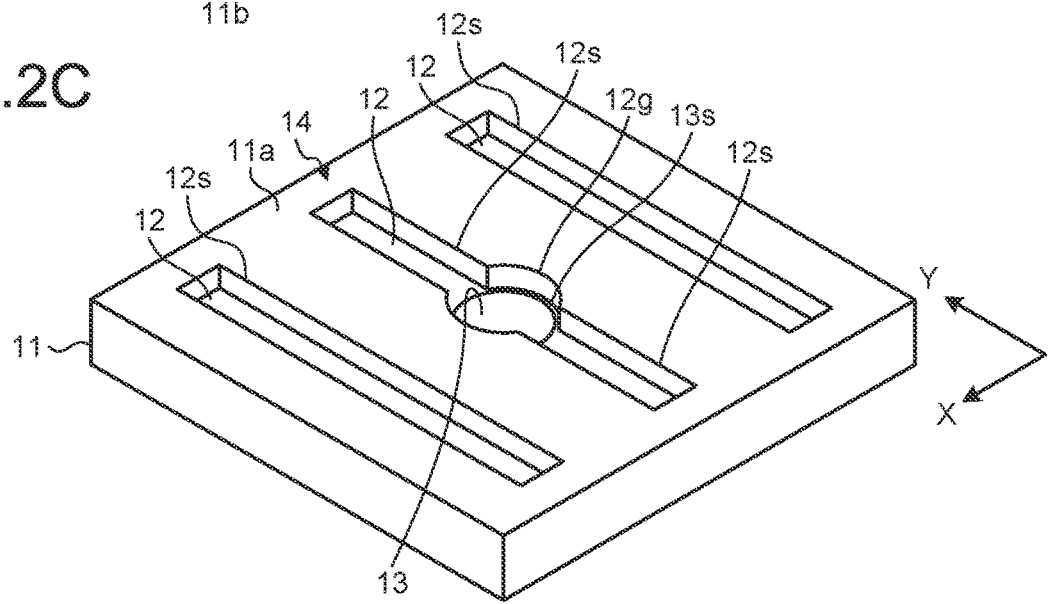

FIGS. 2A to 2C are views illustrating an example of a configuration of the master template 10 according to the first embodiment. FIG. 2A is a plan view of the master template 10, FIG. 2B is a cross-sectional view of the master template 10 taken along the line A-A, and FIG. 2C is a perspective view of the master template 10.

In addition, in FIGS. 2A to 2C, for convenience of explanation, an X direction is determined as a second direction along surfaces 11a and 11b that are main surfaces of the master template 10, and a Y direction is determined as a first direction orthogonal to the X direction along the surfaces 11a and 11b of the master template 10.

As illustrated in FIGS. 2A to 2C, the master template 10 includes the flat substrate 11 formed of a transparent member such as glass, quartz, or the like. The substrate 11 has two main surfaces including the surface 11a as a first surface and the surface 11b as a second surface. The master template 10 has the transfer pattern 14 formed in the surface 11a.

The transfer pattern 14 has the trenches 12 that are aligned in the X direction and extend in the Y direction and the holes 13 that are arranged at positions overlapping with the trenches 12.

The trench 12 has substantially flat side surfaces facing each other and a substantially flat bottom surface, and has a portion 12g in which the hole 13 is arranged and a portion 12s other than the portion 12g. In the X direction, a width of the portion 12g is wider than a width of the portion 12s.

The hole 13 arranged at the position overlapping with the portion 12g of the trench 12 has a bottom surface 13b having a reaching depth deeper than a depth of the bottom surface of the trench 12 in the substrate 11. The bottom surface 13b of the hole 13 is substantially flat. Here, the "substantially flat" means that the bottom surface is flat enough to be within a range of a machining tolerance that may occur in a manufacturing process of the master template 10 to be described below.

A cross section of the hole 13 has, for example, a circular shape, an elliptical shape, or an oval shape, the cross section being orthogonal to a depth direction of the hole, and in the Y direction, a diameter of the hole 13 is wider than the width of the portion 12s of the trench 12 and is narrower than the width of the portion 12g of the trench 12.

That is, the shape of the cross section of the hole 13 is similar to that of, for example, the portion 12g of the trench 12, and is configured to be slightly smaller than the portion 12g, and the hole 13 is arranged substantially at the central portion of the portion 12g of the trench 12. Therefore, a step 13s is formed on a periphery of the hole 13 corresponding to a boundary portion between the hole 13 and the trench 12.

According to the above description, the width of the portion 12g in the X direction, the diameter or the width in the X direction of the hole 13, and the width of the portion 12s in the X direction decrease in the described order (the width of the portion 12g>the diameter of the hole 13>the width of the portion 12s). In this case, the maximum widths of the respective configurations may be compared with each other.

(Method of Manufacturing Master Template)

Next, a method of manufacturing the master template 10 according to the first embodiment will be described with reference to FIGS. 3A to 6Cb. Also in FIGS. 3A to 6Cb, the X direction and the Y direction that coincide with those in FIGS. 2A to 2C described above are defined for convenience. Note that the method of manufacturing the master template 10 according to the first embodiment is a method of forming a pattern for forming the transfer pattern 14 in the substrate 11 of the master template 10.

Figure 3A:
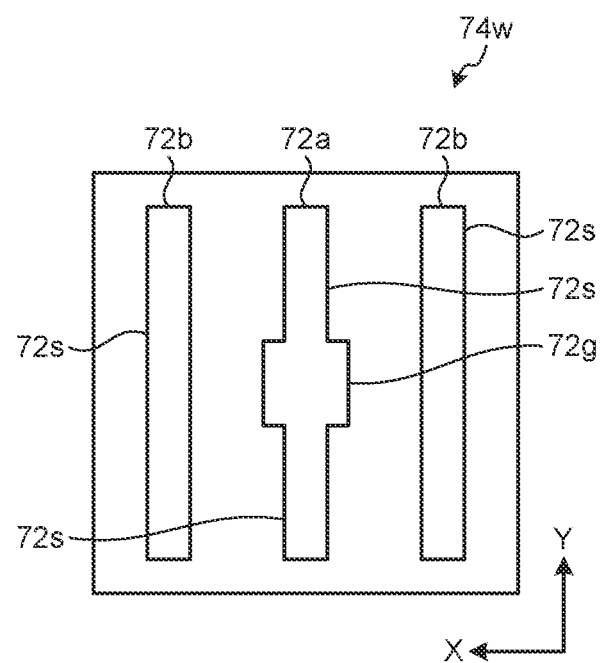
FIGS. 3A and 3B are views illustrating an example of electron beam (EB) drawing data used for manufacturing the master template according to the first embodiment.
Figure 3B:
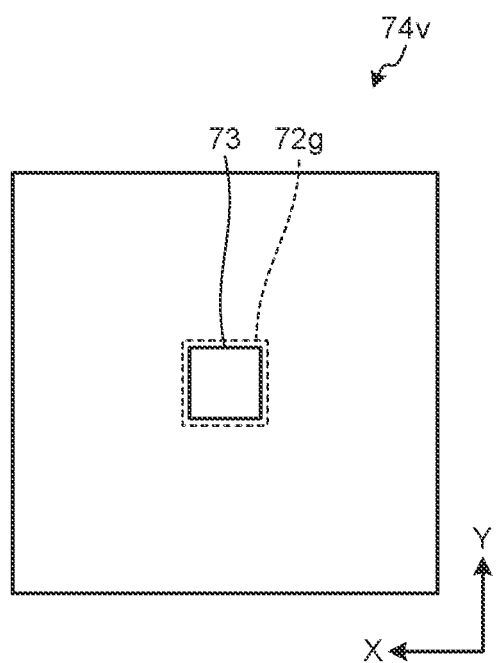

FIGS. 3A and 3B are views illustrating an example of electron beam (EB) drawing data 74w and 74v used for manufacturing the master template 10 according to the first embodiment. The EB drawing data 74w and 74v are data used for drawing a pattern using an electron beam, and an object to be drawn is irradiated with the electron beam according to the EB drawing data 74w and 74v.

As illustrated in FIG. 3A, the EB drawing data 74w has patterns 72a and 72b. The patterns 72a and 72b are aligned and arranged side by side in the X direction, and both extend in the Y direction. The pattern 72a has a rectangular sub-pattern 72g. In the X direction, a width of the sub-pattern 72g is wider than a width of a portion 72s other than the pattern 72a. In the pattern 72b, the width of the portion 72s at any position is equal to the width of the portion 72s of the pattern 72a in the X direction.

As illustrated in FIG. 3B, the EB drawing data 74v has a rectangular pattern 73. The pattern 73 is arranged at a position overlapping with the sub-pattern 72 of the EB drawing data 74w, and has a width slightly smaller than that of the sub-pattern 72g in the X direction and the Y direction.

That is, the shape of the pattern 73 of the EB drawing data 74v is similar to that of, for example, the sub-pattern 72g of the EB drawing data 74w, and is configured to be slightly smaller than the sub-pattern 72g.

When the pattern is drawn using the electron beam, regions of the patterns 72a, 72b, and 73 of the EB drawing data 74w and 74v are irradiated with an electron beam.

FIGS. 4A₀ to 6Cb are views illustrating an example of a procedure of the method of manufacturing the master template 10 according to the first embodiment A to C of FIGS. 4Aa to 6Cb illustrate a state in which the processing proceeds sequentially. The view in which a is attached to A to C of FIGS. 4Aa to 6Cb is a plan view of the surface 11a of the master template 10 in the processing. The view in which b is attached to A to C of FIGS. 4Aa to 6Cb is a cross-sectional view of the master template 10 taken along the line A-A in the processing.

As illustrated in FIGS. 4Aa and 4Ab, a hard mask film 210 formed of Cr or the like is formed on the surface 11a of the substrate 11 formed of glass, quartz, or the like, and a resist film 110 for EB drawing is formed on the hard mask film 210. Then, the patterns 72a and 72b of the EB drawing data 74w described above are transferred to the resist film 110. FIG. 4A₀ illustrates the above-described EB drawing data 74w of FIG. 3A again.

More specifically, regions of the resist film 110 corresponding to the positions of the patterns 72a and 72b of the EB drawing data 74w are irradiated with an electron beam. Therefore, the resist film 110 in the regions irradiated with the electron beam is removed, and the patterns 72a and 72b of the EB drawing data 74w are transferred to the resist film 110.

By transferring the pattern 72a having the sub-pattern 72g of the EB drawing data 74w, a pattern 112a having a sub-pattern 112g is formed in the resist film 110. In this case, the rectangular sub-pattern 72g is transferred to the resist film 110 as a substantially circular sub-pattern 112g due to the influence of the intensity distribution and development of the EB drawing. A portion 112s other than the pattern 112a has a substantially constant width in the X direction similarly to the pattern 72a of a transfer source.

By transferring the pattern 72b of the EB drawing data 74w, a pattern 112b formed of a portion 112s having a substantially constant width in the X direction is formed in the resist film 110.

The lower hard mask film 210 is exposed at bottoms of the patterns 112a and 112b formed by partially removing the resist film 110.

As illustrated in FIGS. 4Ba and 4Bb, by removing the hard mask film 210 exposed from the resist film 110. The patterns 112a and 112b of the resist film 110 are transferred to the hard mask film 210.

By transferring the pattern 112a having the sub-pattern 112g of the resist film 110, the pattern 212a having a substantially circular sub-pattern 212g is formed in the hard mask film 210. A portion 212s other than the sub-pattern 210g of the pattern 212a has a substantially constant width in the X direction similarly to the pattern 112a of a transfer source.

By transferring the pattern 112b of the resist film 110, a pattern 212b formed of the portion 212s having a substantially constant width in the X direction is formed in the hard mask film 210.

The surface 11a of the lower substrate 11 is exposed at the bottoms of the patterns 212a and 212b formed by partially removing the hard mask film 210.

As illustrated, in FIGS. 4Ca and 4Cb, by processing the substrate 11 exposed from the hard mask film 210 to a predetermined depth in a thickness direction, the patterns 212a and 212b of the hard mask film 210 are transferred to the surface 11a of the substrate 11.

By transferring the pattern 212a having the sub-pattern 210g of the hard mask film 210, the trench 12 having the portion 12g having a width wider than that of the other portion 12s in the X direction is formed in the substrate 11.

By transferring the pattern 212b of the hard mask film 210, the trench 12' formed of the portion 12s having a substantially constant width in the X direction is formed in the substrate 11.

As illustrated in FIGS. 5Aa and 5Ab, the hard mask film 210 is removed from the surface 11a of the substrate 11.

As illustrated in FIGS. 5Ba, and 5Bb, a hard mask film 220 is newly formed on the surface 11a of the substrate 11. The hard mask film 220 is formed on the surface 11a of the substrate 11 and the bottom surface of each trench 12.

As illustrated in FIGS. 5Ca and 5Cb, a resist film 120 for EB drawing is formed on the hard mask film 220. Then, the pattern 73 of the EB drawing data 74v described above is transferred to the resist film 120. FIG. 5C₀ illustrates the above-described EB drawing data 74v of FIG. 3B again.

More specifically, a region of the resist film 120 corresponding to the position of the pattern 73 of the EB drawing data 74v is irradiated with an electron beam. Therefore, the resist film 120 in the region irradiated with the electron beam is removed, and the pattern 73 of the EB drawing data 74v is transferred to the resist film 120. In this case, the rectangular pattern 73 is transferred to the resist film 120 as a substantially circular pattern 123 due to the influence of the intensity distribution and development of the EB drawing.

In addition, as described above, the pattern 73 of the EB drawing data 74v is slightly smaller than the sub-pattern 72g of the EB drawing data 74w, and is arranged at a position overlapping with the sub-pattern 72g. Therefore, the pattern 123 of the resist film 120 is slightly smaller than the portion 12g of the trench 12 of the substrate 11 formed by transferring the sub-pattern. 112g of the resist film 110, and is formed at a position overlapping with the portion 12g of the trench 12.

Therefore, in the portion 12g of the trench 12, an end of the pattern 123 of the resist film 120 is arranged in the trench 12. In other words, a side surface of an outer peripheral portion of the portion 12g of the trench 12 covered with the resist film 120. In addition, the lower hard mask film 220 is exposed near the center of the bottom surface of the portion 12g of the trench 12.

Here, when the pattern 73 of the EB drawing data 74v is transferred to the resist film 120, a positional deviation from the trench 12 formed in the substrate 11 based on the EB drawing data 74w may occur. In addition, a dimensional variation in manufacturing may occur in the pattern 123 and the portion 12g of the trench 12. Since the pattern 73 of the EB drawing data 74v is designed to be smaller than the sub-pattern 72g of the EB drawing data 74w, the pattern 123 of the resist film 120 is formed to fall within the range of the portion 12g of the trench 12 of the substrate 11, even in a case where the positional deviation or dimensional variation occurs.

In other words, the pattern 73 of the EB drawing data 74v is designed to be smaller than the sub-pattern 72g of the EB drawing data 74w by a maximum edge positional deviation amount that may occur at the end (edge) of the pattern 123 of the resist film 120 and the end (edge) of the portion 12g of the trench 12 of the substrate 11.

As illustrated in FIGS. 6Aa and 6Ab, by removing the hard mask film 220 exposed from the resist film 120, the pattern 123 of the resist film 120 is transferred to the hard mask film 220.

By transferring the pattern 123 of the resist film 120, a part of the hard mask film 220 formed on the bottom surface of the portion 12g of the trench 12 removed to form a pattern 223 in the hard mask film 220. In this case, the hard mask film 220 remains in an annular shape on the side surface of the portion 12g of the trench 12. The bottom surface of the central portion of the portion 12g of the trench 12 is exposed from the pattern 223 of the hard mask film 220.

As illustrated in FIGS. 6Ba and 6Bb, the bottom surface of the portion 12g of the trench 12 of the substrate 11 exposed from the hard mask film 220 is processed to a predetermined depth in the thickness direction of the substrate 11. Therefore, the pattern 223 of the hard mask film 220 is transferred to the substrate 11.

By transferring the pattern 223 of the hard mask film 220, the hole 13 having a width wider than that of the portion 12s of the trench 12 and narrower than that of the portion 12g in the X direction is formed in the substrate 11. By further digging the hole from the bottom surface of the trench 12, the bottom surface of the hole 13 reaches a position deeper than the bottom surface of the trench 12 in the thickness direction of the substrate 11. In this case, the bottom surface of the hole 13 is a substantially flat surface in which unevenness is suppressed within the range of the machining tolerance when the hole 13 is formed. In addition, a portion covered by the hard mask film 220 remaining in an annular shape on a side wall of the portion 12g of the trench 12 remains as the step 13s surrounding the periphery the hole 13.

As illustrated in FIGS. 6Ca and 6Cb, the remaining hard mask film 220 is removed from the surface 11a of the substrate 11 and the bottom surface of the trench 12.

As described above, the master template 10 having the transfer pattern 14 formed on the surface 11a according to the first embodiment is manufactured.

As described above, thereafter, the transfer pattern 14 of the master template 10 is transferred to the replica template 20, and the transfer pattern 24 of the replica template 20 is transferred to the film 41 to be processed of the semiconductor device 40. In addition, the pattern 44 of the film 41 to be processed is filled with a conductive material. As described above, the dual damascene pattern 94 having the wiring 92 and the via 93 is formed on the film 41 to be processed of the semiconductor device 40.

(Configuration Example of Dual Damascene Pattern)

Next, a configuration example of the dual damascene pattern 94 formed on the semiconductor device 40 according to the first embodiment will be described with reference to FIG. 1.

FIG. 7 is a perspective view illustrating an example of the configuration of the dual damascene pattern 94 formed in the semiconductor device 40 according to the first embodiment. More specifically, FIG. 7 illustrates the dual damascene pattern 94 formed on the semiconductor device 40 when viewed from below the film 41 to be processed. In FIG. 7, only an upper surface of the film 41 to be processed is illustrated. In FIG. 7, the X direction and the Y direction that coincide with those in FIGS. 2A to 2C described above are defined for convenience, and a Z direction that is a depth direction of the film 41 to be processed is illustrated.

As illustrated in FIG. 7, the dual damascene pattern 94 is formed on the film 41 to be processed of the semiconductor device 40. The dual damascene pattern 94 has the wiring 92 that is aligned in the X direction and extends in the Y direction, and the via 93 that is extends below the wiring 92 at a position overlapping the wiring 92.

The wiring 92 has substantially flat side surfaces facing each other, and a substantially flat upper surface and bottom surface. The bottom surface of the wiring 92 is positioned at a predetermined depth of the film 41 to be processed. In addition, the wiring 92 has a portion 92g in which the via 93 is arrange and a portion 92s other than the portion 92g. In the X direction, a width of the portion 92g is wider than a width of the portion 92s.

The via 93 arranged at a position overlapping with the portion 92g of the wiring 92 has a reaching depth in the film 41 to be processed deeper than that of the bottom surface of the wiring 92, and penetrates, for example, the film 41 to be processed. A bottom surface 93b of the via 93 as substantially flat. This is because the shape of the via 93 is formed from the hole 13 having the flat bottom surface of the master template 10 through the replica template 20.

Similarly to the shape of the cross section of the hole 13 of the master template 10, a shape of a cross section of the via 93 is, for example, a circular shape, an elliptical shape, or an oval shape, the cross section being orthogonal to the depth direction of the via, and a width of the via 93 is narrower than the width of the portion 92g of the wiring 92 and wider than the width of the portion 92s in the X direction.

That is, the shape of the cross section of the via 93 is similar to that of, for example, the portion 92g of the wiring 92, and is configured to be slightly smaller than the portion 92g, and the via 93 is arranged to fall within the region of the portion 92g of the wiring 92. This is based on the fact that the hole 13 of the master template 10 is set to a size that falls within the region of the portion 12g of the trench 12 in consideration of the maximum edge positional deviation amount in the manufacturing process of the master template 10. As described above, a step 93s is formed on a periphery of the via 93 corresponding to a boundary portion between the wiring 92 and the via 93.

(Comparative Example)

Next, a method of manufacturing a master template 10' according to a comparative example will be described with reference to FIGS. 8A₀ to 9Cb. FIGS. 8A₀ to 9Cb are views illustrating an example of a procedure of the method of manufacturing the master template 10' according to the comparative example.

In the method of manufacturing the master template 10' according to the comparative example, for example, two types of EB drawing data are also used.

As illustrated in FIG. 8A₀, the first EB drawing data 74w' has patterns 72' that are aligned in the X direction and extend in the Y direction. All of widths of the patterns 72' in the X direction are constant.

As illustrated in FIGS. 8Aa and 8Ab, a hard mask film 210' is formed on a substrate 11' for manufacturing the master template 10', and a resist film 110' is formed on the hard mask film 210'. Patterns 112' that are aligned in the X direction and extend in the Y direction are formed in the resist film 110' using the EB drawing data 74w'. All of widths of the patterns 112' in the X direction are constant.

As illustrated in FIGS. 8Ba and 8Bb, the patterns 112' of the resist film 110' are transferred to form patterns 212' that are aligned in the X direction and extend in the Y direction in the hard mask film 210'. All of widths of the patterns 212' in the X direction are constant.

The patterns 212' of the hard mask film 210' are transferred to form trenches 12' that are aligned in the X direction and extend in the Y direction in the substrate 11'. All of widths of the trenches 12' in the X direction are substantially constant.

As illustrated in FIGS. 8Ca and 8Cb, the hard mask film 210' is removed to newly form a hard mask film 220' on the entire surface of the substrate 11'.

As illustrated in FIG. 9A₀, the second EB drawing data 74v' has a rectangular pattern 73' at a position overlapping with the pattern 72' of the EB drawing data. 74w'.

As illustrated in FIGS. 9Aa and 9Ab, a resist film 120' is formed on the newly formed hard mask film 220', and the pattern 73' of the EB, drawing data 74v' is transferred. In the resist film 120', a substantially circular pattern 123' is formed at a position overlapping with the trench 12' of the substrate 11'. At a bottom of the pattern 123' of the resist film 120', the hard mask film 220' formed on a surface of the substrate 11' and a bottom surface of the trench 12' of the substrate 11' is exposed.

However, when the pattern 73' of the EB drawing data 74v' is transferred to the resist film 120', a positional deviation and dimensional variation from the trench 12' formed in the substrate 11' based on the EB drawing data 74w' may occur.

As illustrated in FIGS. 9Ba and 9Bb, by removing the hard mask film 220' exposed from the resist film 120', a pattern 223' on which the pattern 123' of the resist film 120' is transferred is formed in the hard mask film 220'. At a bottom of the pattern 223', the surface of the substrate 11' and the bottom surface of the trench 12' of the substrate 11' are exposed.

As illustrated in FIGS. 9Ca and 9Bb, the substrate 11' exposed from the hard mask film 220' is processed to a predetermined depth to form a hole 13' that is extends downwardly from the bottom surface of the trench 12'. Since the substrate 11' exposed from the hard mask film 220' has a step, a concave portion 13r' extending across the bottom surface of the hole 13' in the Y direction is formed on the bottom surface or the hole 13'. Such a concave portion 13r' is also transferred to the via formed in the semiconductor device, such that unevenness is generated on the bottom surface of the via, which may cause a connection failure or the like with the lower wiring.

In addition, as described above, when the pattern 123' of the resist film 120' is formed, in a case where a positional deviation or dimensional variation from the trench 12' formed in the substrate 11' occurs, there is a risk that a distance between the hole 13' formed at the position overlapping with one trench 12' and the adjacent trench 12' is too close. By using the master template 10' having such a transfer pattern, a short circuit may occur between the via formed in the semiconductor device and the adjacent wiring.

According to the method of manufacturing the master template 10 of the first embodiment, the pattern 112a that has a substantially constant width in the X direction and extends in the Y direction with the portion 112g having a width wider than the width described above in the X direction is formed in the resist film 110 and on the surface 11a of the substrate 11. By forming the trench 12 having the portion 12 in the substrate 11 according to the resist film 110, the master template 10 having the hole 13 having the substantially flat bottom surface 13b can be manufactured.

Therefore, the via 93 having the substantially flat bottom surface 93b can be formed on the film 41 to be processed of the semiconductor device 40 using the master template 10 and the replica template 20. Accordingly, for example, a connection failure between the via 93 and the lower wiring can be suppressed.

According to the method of manufacturing the master template 10 of the first embodiment, the pattern 123 having a width wider than the width of the portion 12s of the trench 12 and narrower than the width of the portion 12g is formed in the resist film 120 at a position overlapping with the portion 12g of the trench 12. By forming the hole 13 in the substrate 11 according to the resist film 120, the hole 13 can be formed to fall the region of the portion 12g of the trench 12.

Therefore, the dual damascene pattern 94 having a predetermined interval of the wirings 92 can be formed on the film 41 to be processed of the semiconductor device 40 using the master template 10 and the replica template 20. Accordingly, it is possible to form the via 93 having a diameter larger than the width of the wiring 92 while suppressing a short circuit between the via 93 arranged at a position overlapping with one wiring 92 and the adjacent wiring 92.

(Modification)

In the first embodiment described above, among the two types of EB drawing data 74w and 74v, the EB drawing data 74w is first used to form the trench 12 in the substrate 11, and then the EB drawing data 74v is used to form the hole 13 in the substrate 11. However, this process order can be changed. The master template 10 of the modification is different from that of the first embodiment in the order of processes of the manufacturing method.

FIGS. 10A₀ to 12Cb are views illustrating an example of a procedure of a method of manufacturing the master template 10 according to the modification of the first embodiment. Also in FIGS. 10A₀ to 12Cb, the X direction and the Y direction that coincide with those in FIGS. 2A to 2C described above are defined for convenience. Note that the method of manufacturing the master template 10 according to the modification is a method of forming a pattern for forming the transfer pattern 14 in the substrate 11 of the master template 10.

In addition, A to C of FIGS. 10Aa to 12Cb illustrate a state in which the processing proceeds sequentially. The view in which a is attached to A to C of FIGS. 10Aa to 12Cb is a plan view of the surface 11a side of the master template 10 in the processing. The view in which b is attached to A to C of FIGS. 10Aa to 12Cb is a cross-sectional view of the master template 10 taken along the line A-A in the processing.

As illustrated in FIGS. 10Aa and 10Ab, the hard mask film 220 formed of Cr or the like is formed on the surface 11a of the substrate 11 formed of glass, quartz, or the like, and the resist film 120 for EB drawing is formed on the hard mask film 220.

In addition the pattern 73 of the EB drawing data 74v described above is transferred to the resist film 120. Therefore, the rectangular pattern 73 is transferred to the resist film 120 as the substantially circular pattern 123 due to the influence of the intensity distribution and development of the EB drawing. FIG. 10A$_0$ illustrates the above-described EB drawing data 74v of FIG. 3B again.

As illustrated in FIGS. 10Ba and 10Bb, by removing the hard mask film 220 exposed from the resist film 120, the pattern 123 of the resist film 110 is transferred to the hard mask film 220 to form the pattern 223.

As illustrated in FIGS. 10Ca and 10Cb, by processing the substrate 11 exposed from the hard mask film 220 to a predetermined depth in the thickness direction, the pattern 223 of the hard mask film 220 is transferred to the surface 11a of the substrate 11 to form a hole 13u having a predetermined depth. The hole 13u is a hole having a reaching depth shallower than that of the hole 13 formed in the completed form of the master template 10.

As illustrated in FIGS. 11Aa and 11Ab, the hard mask film 220 is removed from the surface 11a of the substrate 11.

As illustrated in FIGS. 11Ba and 11Bb, the hard mask film 210 is newly formed on the surface 11a of the substrate 11. The hard mask film 210 is formed on the surface 11a of the substrate 11 and a bottom surface of the hole 13u.

As illustrated in FIGS. 11Ca and 11Cb, the resist film 110 for EB drawing is formed on the hard mask film 210. Then, the patterns 72a and 72b of the EB drawing data 74w described above are transferred to the resist film 110. FIG. 11C$_0$ illustrates the above-described EB drawing data 74w of FIG. 3A again.

By transferring the patterns 72a and 72b of the EB drawing data 74w, the patterns 112a and 112b are formed in the resist film 110. In this case, the rectangular sub-pattern 72g is transferred to the resist film 110 as the substantially circular sub-pattern 112g due to the influence of the intensity distribution and development of the EB drawing.

In addition, as described above, the sub-pattern 72g of the EB drawing data 74w is slightly larger than the pattern 73 of the EB drawing data 74v, and is arranged at a position overlapping with the pattern 73. Therefore, the sub-pattern 112g of the resist film 110 is slightly larger than the hole 13u of the substrate 11 formed by transferring the pattern 123 of the resist film 120, and is formed at a position overlapping with the hole 13u.

Therefore, an end of the sub-pattern 112g of the resist film 110 is arranged to surround an outer periphery of an edge of the hole 13u covered with the hard mask film 210. In other words, the edge of the hole 13u covered with the hard mask film 210 protrudes inside the sub-pattern 112g of the resist film 110.

Here, when the sub-pattern 72g of the EB drawing data 74w is transferred to the resist film 110, a positional deviation and dimensional variation from the hole 13u formed in the substrate 11 based on the pattern 73 of the EB drawing data 74v may occur. Since the sub-pattern 72g of the EB drawing data 74w is designed to be larger than the pattern 73 of the BB drawing data 74v, the sub-pattern 112g of the resist film 110 is formed to fall inside the hole 13u of the substrate 11, even in a case where such positional deviation or dimensional variation occurs.

In other words, the sub-pattern 72g of the EB drawing data 74w is designed to be larger than the pattern 73 of the EB drawing data 74v by a maximum edge positional deviation amount that may occur a the end (edge) of the sub-pattern 112g of the resist film 110 and the end (edge) of the hole 13u of the substrate 11.

As illustrated in FIGS. 12Aa and 12Ab, by removing the hard mask film 210 exposed from the resist film 110, the patterns 112a and 112b of the resist film 110 are transferred to the hard mask film 210 to form the patterns 212a and 212b. In this case, the edge of the hole 13u of the substrate 11 is exposed inside the sub-pattern 212g included in the pattern 212a of the hard mask film 210.

As illustrated in FIGS. 12Ba and 12Bb, the surface 11a of the substrate 11 and the edge and the bottom surface of the hole 13u exposed from the hard mask film 210 are processed to a predetermined depth in the thickness direction of the substrate 11. Therefore, the trench 12 dug to a predetermined depth from the surface 11a of the substrate 11 is formed. In addition, the hole 13 in which the hole 13u is further dug is formed. In this case, the bottom surface 13b of the hole 13 is a substantially flat surface in which unevenness is suppressed within the range of the machining tolerance when the hole 13 is formed. In addition, by processing the edge of the hole 13u protruding inside the sub-pattern 212g of the hard mask film 210, the step 13s surrounding the periphery of the hole 13 is formed.

As illustrated in FIGS. 12Ca and 12Cb, the remaining hard mask film 210 is removed from the surface 11a of the substrate 11.

As described above, the master template 10 having the transfer pattern 14 formed in the surface 11a according to the modification is manufactured.

As described above, even if the processes are switched by changing the order of use of the EB drawing data 74w and 74v, the master template 10 of the modification having the same configuration as that of the first embodiment can be manufactured.

However, in the manufacturing process of the master template 10 using the two resist films 110 and 120, the unevenness on the substrate 11 is preferably suppressed to be small until the second resist film is formed. This is because a film thickness difference of the second resist film formed on the substrate 11 can be suppressed to be small. According to the manufacturing method of the first embodiment, the deep hole 13 is not formed until the second resist film 120 is formed, and the unevenness of the substrate 11 is maintained to be small, which is more ideal.

Note that, in the first embodiment and the modification described above, the hole 13 having a cross section slightly smaller than that of the portion 12g of the trench 12 is formed by setting the pattern 73 of the EB drawing data 74v to be smaller than the sub-pattern 72g of the EB drawing data 74w.

However, when a predetermined pattern is formed in the second resist film, in a case where the alignment accuracy and the dimension control of the pattern already formed in the substrate 11 are sufficiently high, a size of the pattern 73 of the EB drawing data 74v may be set to be equal to that of the sub-pattern 72g of the EB drawing data 74w to form the hole 13 having the size of the cross section substantially equal to that of the portion 12g of the trench 12.

By such a method, the master template 10 having the hole 13 having the substantially flat bottom surface 13b can also be manufactured. Note that, in a case where the hole 13 having the size of the cross section substantially equal to that of the portion 12g of the trench 12 is formed, the step 13s is not formed on the periphery of the hole 13.

In addition, the transfer pattern 14 of the master template 10 described in each of the first embodiment and the modification is merely an example, and the transfer pattern can have various designs according to the desired dual damascene pattern 94 formed in the semiconductor device 40. For example, a plurality of holes may be arranged in one trench of the master template.

[Second Embodiment]

Hereinafter, a second embodiment will be described in detail with reference to the drawings. The second embodiment is different from the template 20 of the first embodiment described above in that a template for transferring the dual damascene pattern 94 to the semiconductor device 40 is manufactured without using the master template 10.

(Configuration Example of Template)

FIGS. 13A to 13C are views illustrating an example of a configuration of a template 30 according to the second embodiment. FIG. 13A is a plan view of the template 30, FIG. 13B is a cross-sectional view of the template 30 taken along the line A-A, and FIG. 13C is a perspective view of the template 30.

In addition, in FIGS. 13A to 13C, for convenience of explanation, an X direction is determined as a second direction along surfaces 31a and 31b that are main surfaces of the template 30, and a Y direction is determined as a first direction orthogonal to the X direction along the surfaces 31a and 31b of the template 30.

As illustrated in FIGS. 13A to 13C, the template 30 includes a flat substrate 31 formed of a transparent member such as glass, quartz, or the like. The substrate 31 has two main surfaces including the surface 31a as a first surface and the surface 31b as a second surface. The template 30 has a transfer pattern 34 formed on the surface 31a.

The transfer pattern 34 has a protrusion 32 that is aligned in the X direction and extends in the Y direction, and a columnar portion 33 that is arranged at a position overlapping with the protrusion 32.

The protrusion 32 has a portion 32g having a substantially flat upper surface and side surfaces arranged in both sides of the upper surface in the X direction and having the columnar portion 33 arranged thereon, and a portion 32s other than the portion 32g. In the X direction, a width of the portion 22g is wider than a width of the portion 32s.

The columnar portion 33 arranged at the position overlapping with the portion 32g of the protrusion 32 has an upper surface 33t whose protruding height from the surface 31a of the substrate 31 is higher than the height of the upper surface of the protrusion 32. The upper surface 33t of the columnar portion 33 is substantially flat. Here, the "substantially flat" means that the surface is flat enough to be within a range of a machining tolerance that may occur in a manufacturing process of the template 30 to be described below.

A cross section of the columnar portion 33 has, for example, a circular shape, an elliptical shape, or an oval shape, the cross section being orthogonal to a height direction of the columnar portion, and in the X direction, a diameter of the columnar portion 33 is wider than the width of the portion 32s of the protrusion 32 and is narrower than the portion 32g of the protrusion 32.

That is, the shape of the cross section of the columnar portion 33 is similar to that of, for example, the portion 32g of the protrusion 32, and is configured to be slightly smaller than the portion 32g, and the columnar portion 33 is arranged substantially at the central portion of the portion 32g of the protrusion 32. Therefore, a step 33s is formed on a periphery of the columnar portion 33 corresponding to a boundary portion between the columnar portion 33 and the protrusion 32.

According to the above description, the width of the portion 32g in the X direction, the diameter or the width in the X direction of the columnar portion 33, and the width of the portion 32s in the X direction decrease in the described order (the width of the portion 32g>the diameter of the columnar portion 33>the width of the portion 32s). In this case, the maximum widths of the respective configurations may be compared with each other.

(Method of Manufacturing Template)

Next, a method of manufacturing the template 30 according to the second embodiment will be described with reference to FIGS. 14A to 17Cb. Also in FIGS. 14A to 17Cb, the X direction and the Y direction that coincide with those in FIGS. 13A to 13C described above are defined for convenience. Note that the method of manufacturing the template 30 according to the second embodiment is a method of forming a pattern for forming the transfer pattern 34 on the substrate 31 of the template 30.

FIGS. 14A and 14B are views illustrating an example of EB drawing data 84w and 84v used for manufacturing the template 30 according to the second embodiment.

As illustrated in FIG. 14A, the NB drawing data 84w has patterns 82a and 82b. The patterns 82a and 82b are aligned and arranged side by side in the X direction, and both extend in the Y direction. The pattern 82a has a rectangular sub-pattern 82g. In the X direction, a width of the sub-pattern 82g is wider than a width of a portion 82s other than the pattern 82a. In the pattern 82b, the width of the portion 82s at any position is equal to the width of the portion 82s of the pattern 82a in the X direction.

As illustrated in FIG. 14B, the EB drawing data 84v has a rectangular pattern 83. The pattern 83 is arranged at a position overlapping with the sub-pattern 82 of the EB drawing data 84w, and has a width slightly smaller than that of the sub-pattern 82g in the X direction and the Y direction.

That is, the shape of the pattern 83 of the EB drawing data 84v is similar to that of, for example, the sub-pattern 82g of the EB drawing data 84w, and is configured to be slightly smaller than the sub-pattern 82g.

As described above, the EB drawing data 84w and 84v are inverted patterns of the EB drawing data 74w and 74v of the first embodiment described above, and a region excluding the patterns 82a, 82b, and 83 included in each of the EB drawing data 84w and 84v is irradiated with an electron beam.

FIGS. 15A$_0$ to 17Cb are views illustrating an example of a procedure of a method of manufacturing the template 30 according to the second embodiment. A to C of FIGS. 15Aa to 17Cb illustrate a state in which the processing proceeds sequentially. The view in which a is attached to A to C of FIGS. 15Aa to 17Cb is a plan view of the surface 31a side of the template 30 in the processing. The view in which b is attached to A to C of FIGS. 15Aa to 17Cb is a cross-sectional view of the template 30 taken along the line A-A in the processing.

As illustrated in FIGS. 15Aa and 15Ab, a hard mask film 230 formed of Cr or the like is formed on a surface 31a' of the substrate 31 formed of glass, quartz, or the like, and a resist film 130 for EB drawing is formed on the hard mask film 230. The surface 31a' of the substrate 31 is a main surface in an initial state when the substrate 31 is cut out into a flat shape or rolled, and is a surface that is dug later and substantially disappears.

Next, the patterns 82a and 82b of the EB drawing data 84w described above are transferred to the resist film. 130, and a pattern 132a having a sub-pattern 132g and a pattern 132b are formed. FIG. 15A$_0$ illustrates the above-described EB drawing data 84w of FIG. 14A again.

As described above, the region of the resist film 130 corresponding to the position excluding the patterns 82a and 82*b* of the NB drawing data 84*w* is irradiated with an electron beam, and the resist film 130 of the region irradiated with the electron beam is removed, thereby obtaining the remaining resist film 130 as the patterns 132*a* and 132*b*. In addition, in this case, the rectangular sub-pattern 82*g* is transferred to the resist film 130 as the substantially circular sub-pattern 132*g* due to the influence of the intensity distribution and development of the NB drawing.

As illustrated in FIGS. 15Ba and 15Bb, by removing the hard mask film 230 other than the region protected by the patterns 132*a* and 132*b* of the resist film 130, the patterns 132*a* and 132*b* of the resist film 130 are transferred to the hard mask film 230 to form patterns 232*a* and 232*b*.

As illustrated in FIGS. 15Ca and 15Cb, by processing the substrate 31 other than the region protected by the patterns 232*a* and 232*b* of the hard mask film 230 to a predetermined depth in a thickness direction, the patterns 232*a* and 232*b* of the hard mask film 230 are transferred to the substrate 31 to form a protrusion 32' protruding from a surface 31*a*" of the substrate 31. The surface 31*a*" of the substrate 31 is a new main surface of the substrate 31 obtained by digging the surface 31*a*' described above to a predetermined depth. The protrusion 32' has a portion 32*n*' having a width wider than that of a portion 32*s*' other than the portion 32*g*' in the direction.

As illustrated in FIGS. 16Aa and 16Ab, the hard mask film 230 is removed from the surface 31*a*' of the substrate 31.

As illustrated in FIGS. 16Ba and 16Bb, a hard mask film 240 is newly formed on the surface 31*a*" of the substrate 31. The hard mask film 240 is formed on the surface 31*a*' of the substrate 31 and the upper surface of each protrusion 32'.

As illustrated in FIGS. 16Ca and 16Cb, a resist film 140 for EB drawing is formed on the hard mask film 240. Then, the pattern 83 of the EB drawing data 84*v* described above is transferred to the resist film 140 to form a pattern 143. FIG. 16C$_0$ illustrates the above-described EB drawing data 84*v* of FIG. 14B again.

As described above, the region of the resist film 140 corresponding to the position excluding the pattern 83 of the EB drawing data 84*v* is irradiated with an electron beam, and the resist film 140 of the region irradiated with the electron beam is removed, thereby obtaining the remaining resist film 140 as the pattern 143. In addition, in this case, the rectangular pattern 83 is transferred to the resist film 140 as a substantially circular pattern 143 due to the influence of the intensity distribution and development of the EB drawing.

In addition, as described above, the pattern 83 of the EB drawing data 84*v* is slightly smaller than the sub-pattern 82*g* of the EB drawing data 84*w*, and is arranged at a position overlapping with the sub-pattern 82*g*. Therefore, the pattern 143 of the resist film 140 is slightly smaller than the portion 32*g* of the protrusion 32 of the substrate 31 formed by transferring the sub-pattern 132*g* of the resist film 130, and is formed at a position overlapping with the portion 32*g* of the protrusion 32.

Therefore, an end of the pattern 143 of the resist film 140 is arranged to fall in the region inside the portion 32*g* of the protrusion 32 covered with the hard mask film 240. In other words, an edge of the portion 32*g* of the protrusion 32 covered with the hard mask film 240 protrudes from the end of the pattern 143 of the resist film 140.

However, when the pattern 83 of the EB drawing data 84*v* is transferred to the resist film 140, a positional deviation and dimensional variation from the protrusion 32 formed on the substrate 31 based on the in drawing data 84*w* may occur. Since the pattern 83 of the n drawing data 84*v* is designed to be smaller than the sub-pattern 82*g* of the EB drawing data 84*w*, the pattern 143 of the resist film 140 is formed to fall within the range of the portion 32*g* of the protrusion 32 of the substrate 31, even in a case where such positional deviation or dimensional variation occurs.

In other words, the pattern 83 of the in drawing data 84*v* is designed to be smaller than the sub-pattern 82*g* of the EB drawing data 84*w* by a maximum edge positional deviation amount that may occur at the end (edge) of the pattern 143 of the resist film 140 and the end (edge) of the portion 32*g* of the protrusion 32 of the substrate 31.

As illustrated in FIGS. 17Aa and 17Ab, by removing the hard mask film 240 other than the region protected by the pattern 143 of the resist film 140, the pattern 143 of the resist film 140 is transferred to the hard mask film 240 to form a pattern 243.

Therefore, the surface 31*a*" and the upper surface the protrusion 32' of the substrate 31 excluding the pattern 243 of the hard mask film 240 are exposed. In this case, an edge of the portion 32*g*' of the protrusion 32' of the substrate 31 is exposed in an annular shape on a periphery of the pattern 243 of the hard mask film 240.

A illustrated in FIGS. 17Ba and 17Bb, the surface 31*a*" and the protrusion 32' of the substrate 31 other than the region protected by the pattern 243 of the hard mask film 240 are processed to a predetermined depth in the thickness direction of the substrate 31. Therefore, the pattern 243 of the hard mask film 240 is transferred to the substrate 31.

By transferring the pattern 243 of the hard mask film 240, the surface 31*a*" and the protrusion 32' of the substrate 31 are substantially evenly dug to form the protrusion 32 protruding from the surface 31*a*. In addition, the region protected by the pattern 243 of the hard mask film 240 is the columnar portion 33. The periphery of the base portion of the columnar portion 33 is surrounded by the portion 32*g* of the protrusion 32 to form the step 33*s*.

As illustrated in FIGS. 17Ca and 17Cb, the hard mask film 240 is removed from the upper surface 33*t* of the columnar portion 33 of the substrate 31. Here, the upper surface 33*t* of the columnar portion 33 is a surface in which the surface 31*a*' of the original substrate 31 is maintained in the initial state. Therefore, the upper surface 33*t* of the columnar portion 33 is a substantially flat surface in which unevenness is suppressed within the range of the machining tolerance when the surface 31*a*' of the original substrate 31 is cut out or rolled.

As described above, the template 30 having the transfer pattern 34 formed on the surface 31*a* according to the second embodiment is manufactured.

Thereafter, the transfer pattern 34 of the template 30 is transferred to the film 41 to be processed of the semiconductor device 40. In addition, the pattern. 44 of the film 41 to be processed is filled with a conductive material. As described above, the dual damascene pattern 94 having the wiring 92 and the via 93 is formed on the film 41 to be processed of the semiconductor device 40, as illustrated in FIG. 7.

(Comparative Example)

A template directly transferring the dual damascene pattern 94 to the semiconductor device 40 according to a comparative example can be manufactured using, for example, the inverted patterns of the EB drawing data 74*w*' and 74*v*' used for manufacturing the master template 10' according to the comparative example of the first embodiment described above.

However, also in this case, the upper surface of the columnar portion formed in the template of the comparative example is not a flat surface. In the master template 10' of the comparative example described above, as the concave portion 13r' is formed on the bottom surface of the hole 13', a protrusion serving as an inverted pattern is formed on the upper surface of the columnar portion of the template of the comparative example.

In addition, also in the method of manufacturing the template of the comparative example, the positional deviation and dimensional variation may occur between the pattern of the second resist film and the pattern already formed on the substrate of the template, and the columnar portion formed on one protrusion may be too close to the adjacent protrusion.

According to the method of manufacturing the template 30 of the second embodiment, the pattern 132a that has a substantially constant width in the X direction and extends in the Y direction with the portion 132g having a width wider than the width described above in the X direction is formed in the resist film 130 and on the surface 31a' of the substrate 31. By forming the protrusion 32' having the portion 32g' on the substrate 31 according to the resist film 130, the template 30 having the columnar portion 33 having the substantially flat upper surface 33t can be manufactured.

Therefore, the via 93 having the substantially flat bottom surface 93b can be formed on the film 41 to be processed of the semiconductor device 40 using the template 30. Accordingly, for example, a connection failure between the via 93 and the lower wiring can be suppressed.

According to the method of manufacturing the template 30 of the second embodiment, the pattern 143 having a width wider than the width of the portion 32s of the protrusion 32 and narrower than the width of the portion 32g is formed in the resist film 140 at a position overlapping with the portion 32g of the protrusion 32. By forming the columnar portion 33 on the substrate 31 according to the resist film 140, the columnar portion 33 can be formed to fall in the region of the portion 32g of the protrusion 32.

Therefore, the dual damascene pattern 94 having a predetermined interval of the wirings 92 can be formed on the film 41 to be processed of the semiconductor device 40 using the template 30. Accordingly, it is possible to form the via 93 having a diameter larger than the width of the wiring 92 while suppressing a short circuit between the via 93 arranged at a position overlapping with one wiring 92 and the adjacent wiring 92.

(Modification)

Also in the method of manufacturing the template 30 of the second embodiment described above, it is possible to change the order of the manufacturing processes by changing the order of use of the two types of EB drawing data 84w and 84v. The template 30 of the modification is different from that of the second embodiment in the order of processes of the manufacturing method.

FIGS. 18A$_0$ to 20Cb are views illustrating an example of a procedure of the method of manufacturing the template 30 according to the modification of the second embodiment. Also in FIGS. 18A$_0$ to 20Cb, the X direction and the Y direction that coincide with those in FIGS. 13A to 13C described above are defined for convenience. Note that the method of manufacturing the template 30 according to the modification is a method of forming a pattern for forming the transfer pattern 34 on the substrate 31 of the template 30.

In addition, A to C of FIGS. 18Aa to 20Cb illustrate a state in which the processing proceeds sequentially. The view in which a is attached to A to C of FIGS. 18Aa to 20Cb is a plan view of the surface 31a side of the template 30 in the processing. The view in which b is attached to A to C of FIGS. 18Aa to 20Cb is a cross sectional view of the template 30 taken along the line A-A in the processing.

As illustrated in FIGS. 18Aa and 18Ab, the hard mask film 240 formed of Cr or the like is formed on the surface 31a' of the substrate 31 formed of glass, quartz, or the like, and the resist film 140 for EB drawing is formed on the hard mask film 240.

In addition, the pattern 83 of the EB drawing data 84v described above is transferred to the resist film 140. Therefore, the rectangular pattern 83 is transferred to the resist film 140 as the substantially circular pattern 143 due to the influence of the intensity distribution and development of the EB drawing. FIG. 18A$_0$ illustrates the above-described EB drawing data 84v of FIG. 14B again.

As illustrated in FIGS. 18Ba and 18Bb, by removing the hard mask film 240 other than the region protected by the pattern 143 of the resist film 140, the pattern 143 of the resist film 140 is transferred to the hard mask film 240.

As illustrated in FIGS. 18Ca and 18Cb, by processing the substrate 31 other than the region protected by the pattern 243 of the hard mask film 240 to a predetermined depth in the thickness direction, the surface 31a' of the substrate 31 is dug to obtain the surface 31a''', and a columnar portion 33' protruding from the surface 31a' at a predetermined height is formed. The columnar portion 33' is a columnar portion having a height lower than that of the columnar portion 33 formed in the completed form of the template 30.

As illustrated in FIGS. 19Aa and 19Ab, the hard mask film 240 is removed from an upper surface of the columnar portion 33' of the substrate 31.

As illustrated in FIGS. 19Ba and 19Bb, a hard mask film 230 is newly formed on the surface 31a''' of the substrate 31 and the upper surface of the columnar portion 33'.

As illustrated in FIGS. 19Ca and 19Cb, the resist film 130 for EB drawing is formed on the hard mask film 230. Then, the patterns 82a and 82b of the EB drawing data 84w described above are transferred to the resist film 130. FIG. 19C$_0$ illustrates the above-described EB drawing data 84w of FIG. 14A again.

By transferring the patterns 82a and 82b of the EB drawing data 84w, the patterns 132a and 132b are formed in the resist film 130. In this case, the rectangular sub-pattern 82g is transferred to the resist film 130 as the substantially circular sub-pattern 132g due to the influence of the intensity distribution and development of the EB drawing.

In addition, as described above, the sub-pattern 82g of the EB drawing data 84w is slightly larger than the pattern 83 of the EB drawing data 84v, and is arranged at a position overlapping with the pattern 83. Therefore, the sub-pattern 132g of the resist film 130 is slightly larger than the columnar portion 33' of the substrate 31 formed by transferring the pattern 143 of the resist film 140, and is formed at a position overlapping with the columnar portion 33'.

Therefore, an end of the sub-pattern 132g of the resist film 130 is arranged to cover a periphery of an outer side surface of the columnar portion 33'.

Here, when the sub-pattern 82g of the EB drawing data 84w is transferred to the resist film 130, a positional deviation and dimensional variation from the columnar portion 33' formed on the substrate 31 based on the pattern 83 of the EB drawing data 84v may occur. Since the sub-pattern 82g of the EB drawing data 84w is designed to be larger than the pattern 83 of the EB drawing data 84v, the sub-pattern 132g of the resist film 130 is formed to fall inside the columnar portion 33' of the substrate 31, even in a case where such positional deviation or dimensional variation occurs.

In other words, the sub-pattern 82g of the EB drawing data 84w is designed to be larger than the pattern 83 of the EB drawing data 84v by a maximum edge positional deviation amount that may occur at the end (edge) of the sub-pattern 132g of the resist film 130 and the end (edge) of the columnar portion 33' of the substrate 31.

As illustrated in FIGS. 20Aa and 20Ab, by removing the hard mask film 230 other than the region protected by the patterns 132a and 132b of the resist film 130, the patterns 132a and 132b of the resist film 130 are transferred to the hard mask film 230 to form the patterns 232a and 232b in this case, the sub-pattern 232g included in the pattern 232a of the hard mask film 230 is formed in an annular shape to surround the base portion of the columnar portion 33' of the substrate 31.

Figure 20B:
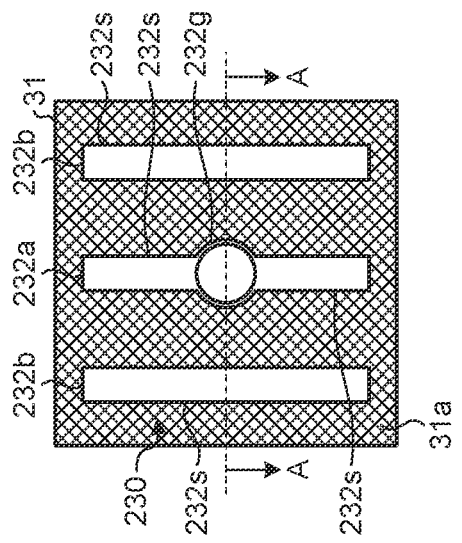
Figure 20B:
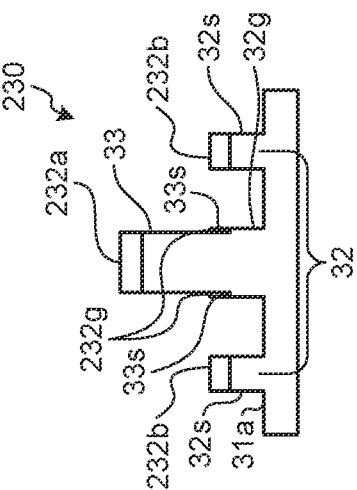

As illustrated in FIGS. 20Ba and 20Bb, the surface 31a" of the substrate 31 other than the region protected by the pattern 232a and 232b of the hard mask film 230 is further dug. Therefore, the protrusion 32 protruding from the surface 11a of the substrate 31 at a predetermined height and the columnar portion 33 are formed. In addition, the step 33s surrounding the periphery the columnar portion 33 is formed by the sub-pattern 232g of the hard mask film 230 surrounding the base portion of the columnar portion 33' in an annular shape.

Figure 20C:
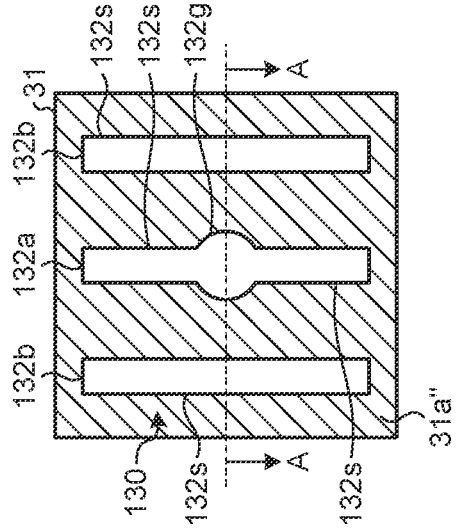
Figure 20C:
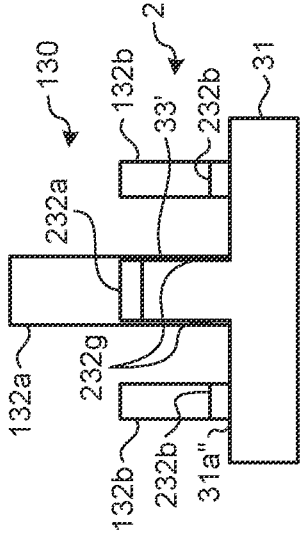

As illustrated in FIGS. 20Ca and 20Cb, the remaining hard mask film 230 is removed from the upper surface of the protrusion 32 of the substrate 31, the upper surface 33t of the columnar portion 33, and the like. Here, the upper surface 33t of the columnar portion 33 is a surface in which the surface 31a' of the original substrate 31 is maintained in the initial state. Therefore, the upper surface 33t of the columnar portion 33 is a substantially flat surface in which unevenness is suppressed within the range of the machining tolerance when the surface 31a' of the original substrate 31 is cut out or rolled.

As described above, the template 30 having the transfer pattern 34 formed on the surface 31a according to the modification is manufactured.

As described above, even if the processes are switched by changing the order of use of the EB drawing data 84w and 84v, the template 30 of the modification having the same configuration as that of the second embodiment can be manufactured. However, according to the manufacturing method of the second embodiment, the columnar portion 33 protruding at a high height is not formed on the substrate 31 until the second resist film 140 is formed, and the unevenness of the substrate 31 is maintained to be small, such that the film thickness difference of the second resist film 140 is suppressed, which is more ideal.

Note that, in the second embodiment and the modification described above, the columnar portion 33 having a cross section smaller than that of the portion 32g of the protrusion 32 is formed by setting the pattern 83 of the EB drawing data 84v to be smaller than the sub-pattern 82g of the EB drawing data 84w.

However, when a predetermined pattern is formed in the second resist film, in a case where the alignment accuracy and the dimension control of the pattern already formed on the substrate 31 are sufficiently high, a size of the pattern 83 of the EB drawing data 84v may be set to be equal to that of the sub-pattern 82g of the EB drawing data 84w to form the columnar portion 33 having the size of the cross section substantially equal to that of the portion 32g of the protrusion 32.

By such a method, the template 30 having the columnar portion 33 having the substantially flat upper surface 33t can also be manufactured. Note that, in a case where the columnar portion 33 having the size of the cross section substantially equal to that of the portion 32g of the protrusion 32 is formed, the step 33s is not formed on the periphery of the columnar portion 33.

In addition, the transfer pattern 34 of the template 30 described in each of the second embodiment and the modification is merely an example, and the transfer pattern can have various designs according to the desired dual damascene pattern 94 formed in the semiconductor device 40. For example, a plurality of columnar portions may be arranged in one protrusion of the template.

[Notes]

Hereinafter, preferred embodiments of the present invention will be noted.

(Note 1)

According to one aspect of the present invention, there is provided a template including:
a substrate having a first surface;
a protrusion that protrudes from the first surface at a predetermined height and extends along the first surface in a first direction, the protrusion includes a first portion having a second width in a second direction intersecting with the first direction and a second portion having a third width in the second direction; and
a columnar portion that is arranged on the first portion of the protrusion and protrudes from an upper surface of the protrusion, the a columnar portion having a first width in the second direction, wherein
the first width is smaller than the second width, and the third width is smaller than the first width.

(Note 2)

The template according to note 1,
wherein the first width is a maximum width of the columnar portion in the second direction, and
the second width is a maximum width of the protrusion in the second direction at the first portion.

(Note 3)

The template according to note 1,
wherein the columnar portion has a flat upper surface.

(Note 4)

The template according to note 1,
wherein a cross section of the columnar portion has a circular shape, an elliptical shape, or an oval shape.

(Note 5)

According to another aspect of the present invention, there is provided a method of manufacturing a template, the method including:
forming, on a first surface of a substrate, a first mask having a first pattern that has a first width and extends along the first surface in a first direction with a first portion having a second width larger than the first width;
transferring the first pattern to the first surface while protecting the first surface by the first mask to form a protrusion that has the first width and extends in the first direction with the first portion having the second width;
forming a second mask having a second pattern having a third width at least larger than the first width at a position overlapping with the first portion of the protrusion; and
transferring the second pattern to the first surface while protecting the first surface by the second mask to form a columnar portion having the third width.

(Note 6)

The method of manufacturing a template according to note 5,
wherein the third width is smaller than the second width.

(Note 7)

The method of manufacturing a template according to note 5,
wherein after the first mask is formed and the protrusion is formed,
the second mask is formed and the columnar portion is formed.

(Note 8)

The method of manufacturing a template according to note 5,
wherein after the second mask is formed and the columnar portion is formed,
the first mask is formed and the protrusion is formed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A template comprising:
a substrate having a first surface;
a trench that is recessed from the first surface at a predetermined depth and extends along the first surface in a first direction, the trench includes a first portion having a first width in a second direction intersecting with the first direction, a second portion having a second width in the second direction, and a third portion having the first width in the second direction, the first to third portions continuously extending in the first direction in this order; and
a hole that is arranged in the second portion of the trench and extends from a bottom surface of the second portion in the trench, the hole having a third width in the second direction, and
the first width is smaller than the third width, and the third width is smaller than the second width.

2. The template according to claim 1,
wherein the third width is a maximum width of the hole in the second direction, and
the second width is a maximum width of the trench in the second direction at the first portion.

3. The template according to claim 1,
wherein the hole has a flat bottom surface.

4. The template according to claim 1,
wherein a cross section of the hole has a circular shape, an elliptical shape, or an oval shape.

* * * * *